United States Patent
Tezen

(10) Patent No.: US 7,462,867 B2
(45) Date of Patent: Dec. 9, 2008

(54) GROUP III NITRIDE COMPOUND SEMICONDUCTOR DEVICES AND METHOD FOR FABRICATING THE SAME

(75) Inventor: Yuta Tezen, Aichi (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 0 days.

(21) Appl. No.: 11/222,792

(22) Filed: Sep. 12, 2005

(65) Prior Publication Data

US 2006/0060866 A1 Mar. 23, 2006

Related U.S. Application Data

(62) Division of application No. 10/221,528, filed on Mar. 18, 2003, now Pat. No. 6,967,122.

(51) Int. Cl.
*H01L 29/26* (2006.01)
*H01L 29/20* (2006.01)

(52) U.S. Cl. .......... 257/79; 257/615; 257/E33.006; 438/481

(58) Field of Classification Search .......... 438/341, 438/478, 481, 39, 41–42, 44; 257/79, 615, 257/E33.001, E33.002, E33.003, E33.005, 257/E33.006
See application file for complete search history.

(56) References Cited

U.S. PATENT DOCUMENTS

| | | | |
|---|---|---|---|
| 5,185,290 A | 2/1993 | Aoyagi et al. | |
| 5,798,536 A | 8/1998 | Tsutsui | |
| 6,051,849 A | 4/2000 | Davis et al. | |
| 6,110,277 A | 8/2000 | Braun | |
| 6,121,121 A | 9/2000 | Koide | |
| 6,146,457 A | 11/2000 | Solomon | |

6,153,010 A * 11/2000 Kiyoku et al. ................ 117/95

(Continued)

FOREIGN PATENT DOCUMENTS

EP 0 551 721 A2 7/1993

(Continued)

OTHER PUBLICATIONS

Translation of WO 9847170 A1 to Kiyoku et al.*

(Continued)

*Primary Examiner*—Douglas M. Menz
*Assistant Examiner*—Matthew W Such
(74) *Attorney, Agent, or Firm*—McGinn IP Law Group, PLLC

(57) ABSTRACT

A sapphire substrate 1 is etched so that each trench has a width of 10 μm and a depth of 10 μm were formed at 10 μm of intervals in a stripe pattern. Next, an AlN buffer layer 2 having a thickness of approximately 40 nm is formed mainly on the upper surface and the bottom surface of the trenches of the substrate 1. Then a GaN layer 3 is formed through vertical and lateral epitaxial growth. At this time, lateral epitaxial growth of the buffer layer 21, which was mainly formed on the upper surface of the trenches, filled the trenches and thus establishing a flat top surface. The portions of the GaN layer 3 formed above the top surfaces of the mesas having a depth of 10 μm exhibited significant suppression of threading dislocation in contrast to the portions formed above the bottoms of the trenches.

17 Claims, 18 Drawing Sheets

U.S. PATENT DOCUMENTS

| | | | |
|---|---|---|---|
| 6,232,623 B1 * | 5/2001 | Morita | 257/103 |
| 6,265,289 B1 * | 7/2001 | Zheleva et al. | 438/503 |
| 6,266,355 B1 * | 7/2001 | Sverdlov | 372/45.01 |
| 6,274,518 B1 | 8/2001 | Yuri et al. | |
| 6,316,785 B1 * | 11/2001 | Nunoue et al. | 257/14 |
| 6,319,742 B1 | 11/2001 | Hayashi et al. | |
| 6,329,667 B1 | 12/2001 | Ota et al. | |
| 6,335,546 B1 * | 1/2002 | Tsuda et al. | 257/94 |
| 6,355,497 B1 | 3/2002 | Romano et al. | |
| 6,365,921 B1 | 4/2002 | Watanabe et al. | |
| 6,380,108 B1 * | 4/2002 | Linthicum et al. | 438/791 |
| 6,403,451 B1 * | 6/2002 | Linthicum et al. | 438/479 |
| 6,521,514 B1 * | 2/2003 | Gehrke et al. | 438/479 |
| 6,617,182 B2 * | 9/2003 | Ishida et al. | 438/22 |
| 6,835,956 B1 * | 12/2004 | Nagahama et al. | 257/79 |
| 2001/0008791 A1 * | 7/2001 | Gehrke et al. | 438/481 |
| 2002/0069816 A1 * | 6/2002 | Gehrke et al. | 117/84 |
| 2003/0092230 A1 | 5/2003 | Koike et al. | |
| 2003/0092263 A1 | 5/2003 | Koike et al. | |
| 2004/0048448 A1 | 3/2004 | Koike et al. | |

FOREIGN PATENT DOCUMENTS

| | | |
|---|---|---|
| EP | 0 779 666 A3 | 6/1997 |
| EP | 0 951 055 A2 | 10/1999 |
| EP | 0 993 048 A2 | 4/2000 |
| EP | 1 045 431 A1 | 10/2000 |
| EP | 1 059 661 A2 | 12/2000 |
| EP | 1 059 677 A2 | 12/2000 |
| JP | 49-149679 | 4/1973 |
| JP | 48-95181 | 12/1973 |
| JP | 51-137393 | 11/1976 |
| JP | 55-34646 | 8/1978 |
| JP | 57-115849 | 7/1982 |
| JP | 58-33882 | 2/1983 |
| JP | 1-316459 | 12/1989 |
| JP | 3-133182 | 6/1991 |
| JP | 4-10665 | 1/1992 |
| JP | 4-84418 | 3/1992 |
| JP | 4-303920 | 10/1992 |
| JP | 5-41536 | 2/1993 |
| JP | 5-110206 | 4/1993 |
| JP | 5-283744 | 10/1993 |
| JP | 5-343741 | 12/1993 |
| JP | 6-196757 | 7/1994 |
| JP | 7-249830 | 9/1995 |
| JP | 7-273367 | 10/1995 |
| JP | 8-64791 | 3/1996 |
| JP | 8-102549 | 4/1996 |
| JP | 8-116090 | 5/1996 |
| JP | 8-222812 | 8/1996 |
| JP | 8-274411 | 10/1996 |
| JP | 9-162125 | 6/1997 |
| JP | 09-307193 | 11/1997 |
| JP | 10-312971 | 11/1998 |
| JP | 10-321954 | 12/1998 |
| JP | 11-31864 | 2/1999 |
| JP | 11-043398 | 2/1999 |
| JP | 11-135770 | 5/1999 |
| JP | 11-135832 | 5/1999 |
| JP | 11-145516 | 5/1999 |
| JP | 11-145519 | 5/1999 |
| JP | 11-191533 | 7/1999 |
| JP | 11-191657 | 7/1999 |
| JP | 11-191659 | 7/1999 |
| JP | 11-219910 | 8/1999 |
| JP | 11-251632 | 9/1999 |
| JP | 11-260737 | 9/1999 |
| JP | 11-274082 | 10/1999 |
| JP | 11-312825 | 11/1999 |
| JP | 11-329971 | 11/1999 |
| JP | 11-330546 | 11/1999 |
| JP | 11-340508 | 12/1999 |
| JP | 2000-21789 | 1/2000 |
| JP | 2000-44121 | 2/2000 |
| JP | 2000-91253 | 3/2000 |
| JP | 2000-106455 | 4/2000 |
| JP | 2000-106473 | 4/2000 |
| JP | 2000-124500 | 4/2000 |
| JP | 2000-150959 | 5/2000 |
| JP | 2000-174393 | 6/2000 |
| JP | 2000-232239 | 8/2000 |
| JP | 2000-244061 | 9/2000 |
| JP | 2000-261106 | 9/2000 |
| JP | 2000-277437 | 10/2000 |
| JP | 2000-299497 | 10/2000 |
| JP | 2000-357663 | 12/2000 |
| JP | 2000-357843 | 12/2000 |
| JP | 2001-60719 | 3/2001 |
| JP | 2001-93837 | 4/2001 |
| JP | 2001-111174 | 4/2001 |
| JP | 2001-122693 | 5/2001 |
| JP | 2001-176813 | 6/2001 |
| JP | 2001-257193 | 9/2001 |
| WO | WO97/11518 | 3/1997 |
| WO | WO98/47170 | 10/1998 |
| WO | WO 9847170 A1 * | 10/1998 |
| WO | WO 99/01594 | 1/1999 |
| WO | WO 99/65068 | 12/1999 |
| WO | WO 00/04615 | 1/2000 |
| WO | WO00/55893 | 9/2000 |
| WO | WO 02/058120 A1 | 7/2002 |

OTHER PUBLICATIONS

Kuznia, et al. "Influence on Buffer Layers on the Deposition of High Quality Single Crystal GaN Over Sapphire Substrate." Appl. Phys. Lett. vol. 73 (1993): pp. 4700-4702.*

Korean Office Action dated Oct. 28, 2005 with Japanese translation.

Tsvetanka S. Zheleva, et al., "Pendeo-Epitaxy—A New Approach for Lateral Growth of Gallium Nitride Structures", MRS Internet J. Nitride Semicond. Res. 4S1, G3.38 (1999) (.6 pages total).

Wolf, et al., "Silicon Processing for the VLSI Era, Silicon: Single Crystal Growth and Wafer Preparation", vol. 1, p. 5, Lattice Press, 1986.

Ujiie, et al., "Epitaxial Lateral Overgrowth of GaAs on a Si Substrate", Japanese Journal of Applied Physics vol. 28, No. 3, Mar. 1989, pp. L337-L339.

Partial Translation of the Office Action for Japanese Patent Application No. 9-311518, dated Jun. 10, 2003.

D. Kapoinek, et al., "Anisotropic expitaxial lateral growth in GaN selective area epitaxy", Appl. Phys. Lett. 71(9), Sep. 1, 1997, pp. 1204-1206.

Matsushima, et al., "Selective growth of GaN on sub-micron pattern by MOVPE", Technical Report of IEICE, ED97-32, CPM97-20 (May 1997), pp. 41-46.

Akasaki et al., "Effects of AIN Buffer Layer on Crystallographic Structure and on Electrical and Optical Properties of GaN and Ga1-xA1xN...Movpe" pp. 209-219, Journal of Crystal Growth 98 (1989) North-Holland, Amsterdam.

Yang et al., High quality GaN-InGaN heterostructures grown on (111) silicon substrates, pp. 3566-3568, Appl. Phys. Lett. 69 (23), Dec. 2, 1996.

Luther et al., "Titanium and titanium nitride contacts to n-type gallium nitride", Semicond. Sci. Technol. 13 (1998) pp. 1322-1327.

Dimitriadis et al., "Contacts of titanium nitride to—and p-type gallium nitride films", Solid-State Electronics 43 (1999), pp. 1969-1972.

Uchida et al., "AlGaInN based Laser Diodes", In-Plans Semiconductor Lasers IV, III-Vs Review vol. 13, No. 3, May/Jun. 2000, pp. 156-164.

Zheleva et al., "Pendeo-Epitaxy: A New Approach for Lateral Growth of Gallium Nitride Films", Journal of Electronic Materials, vol. 28, No. 4, 1999, pp. L5-L8.

Nam et al., "Lateral epitaxy of low defect density GaN layers via organometallic vapor phase epitaxy", pp. 2638-2640, Appl. Phys. Lett. 71 (18), Nov. 3, 1997.

Hiramatsu et al., "Selective area growth and epitaxial lateral overgrowth of GaN by metalorganic vapor phase epitaxy a hydride vapor phase epitaxy", pp. 104-111, Materials Science and Engineering B59 (1999).

PCT Form 210 (PCT/JP02/05446).
PCT Form 210 (PCT/JP02/02628).
PCT Form 210 ((PCT/JP02/01159).
PCT Form 210 (PCT/JP01/01928).
PCT Form 210 (PCT/JP01/02695).
PCT Form 210 (PCT/JP00/09120).
PCT Form 210 (PCT/JP01/01396).
PCT Form 210 (PCT/JP01/01178).
PCT Form 210 (PCT/JP01/01663).
PCT Form 210 (PCT/JP00/09121).
PCT Form 210 (PCT/JP00/09220).
PCT Forms 338 and 409 (IPER) (PCT/JP01/02695).
PCT Forms 338 and 409 (IPER) (PCT/JP01/01663).
PCT Forms 338 and 409 (IPER) (PCT/JP00/09120).
PCT Forms 338 and 409 (PCT/JP01/01928) and translations thereof.
PCT Form 409 (PCT/JP01/01396).
European Search Report (EP 27057) Jul. 18, 2000.
European Search Report (EP 27279) Feb. 15, 2002.
PCT Form 338 (IPER) (PCT/JP00/09121).
PCT Forms 338 and 409 (IPER) (PCT/JP01/10396) (Translation).
PCT Forms 338 and 409 (IPER) (PCT/JP02/05446) and translations thereof.
PCT Forms 338 and 409 (IPER) (PCT/JP02/02628) and translations thereof.
PCT Forms 338 and 409 (IPER) (PCT/JP02/01159) and translations thereof.
PCT Forms 338 and 409 (IPER) (PCT/JP01/01396) and translations thereof.
Korean Office Action dated May 9, 2006.

* cited by examiner

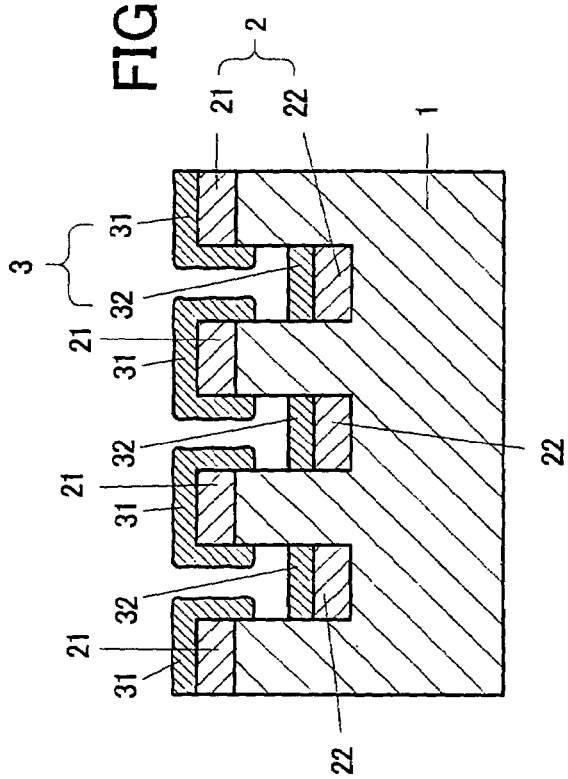
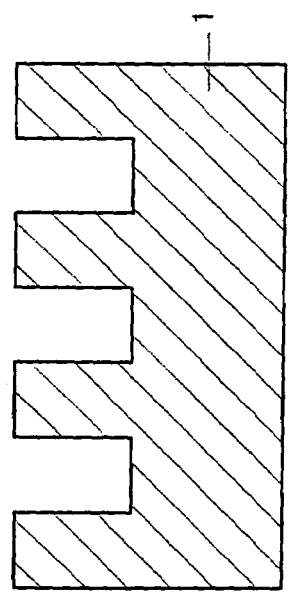
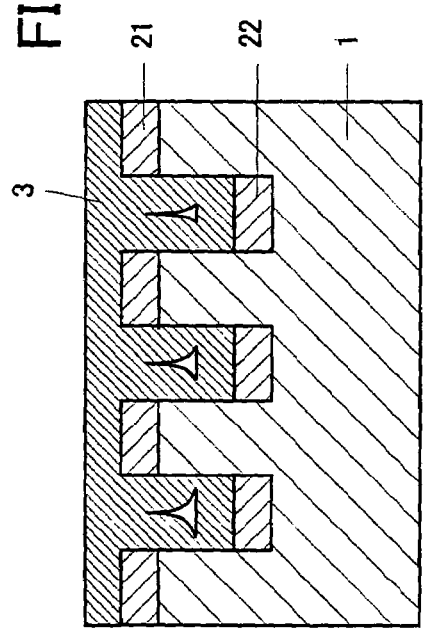
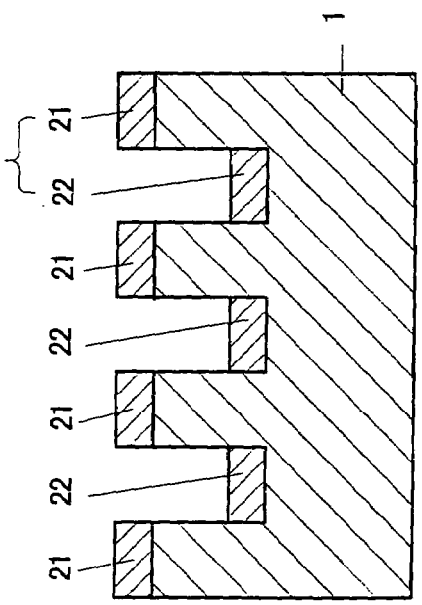

GROUP III NITRIDE COMPOUND SEMICONDUCTOR DEVICES AND METHOD FOR FABRICATING THE SAME

The present application is a Divisional Application of U.S. patent application Ser. No. 10/221,528, filed on Mar. 18, 2003 now U.S. Pat. No. 6,967,122.

TECHNICAL FIELD

The present invention relates to a method for fabricating Group III nitride compound semiconductors. More particularly, the present invention relates to a method for fabricating Group III nitride compound semiconductors employing epitaxial lateral overgrowth (ELO), Group III nitride compound semiconductor devices, and to Group III nitride compound semiconductor substrates. The Group III nitride compound semiconductors are generally represented by $Al_xGa_yIn_{1-x-y}N$ (wherein $0 \leq x \leq 1$, $0 \leq y \leq 1$, and $0 \leq x+y \leq 1$), and examples thereof include binary semiconductors such as AlN, GaN, and InN; ternary semiconductors such as $Al_xGa_{1-x}N$, $Al_xIn_{1-x}N$, and $Ga_xIn_{1-x}N$ (wherein $0 < x < 1$); and quaternary semiconductors such as $Al_xGa_yIn_{1-x-y}N$ (wherein $0 < x < 1$, $0 < y < 1$, and $0 < x+y < 1$).

In the present specification, unless otherwise specified, "Group III nitride compound semiconductors" encompass Group III nitride compound semiconductors which are doped with an impurity so as to assume p-type or n-type conductivity.

BACKGROUND ART

Group III nitride compound semiconductor are direct-transition semiconductors exhibiting a wide range of emission spectra from UV to red light when used in a device such as a light-emitting device, and have been used in light-emitting devices such as light-emitting diodes (LEDs) and laser diodes (LDs). In addition, due to their broad band gaps, devices employing the aforementioned semiconductors are expected to exhibit reliable operational characteristics at high temperature as compared with those employing semiconductors of other types, and thus application thereof to transistors such as FETs has been energetically studied. Moreover, since Group III nitride compound semiconductors contain no arsenic (As) as a predominant element, application of Group III nitride compound semiconductors to various semiconducting devices has been longed for from the environmental aspect. Generally, these Group III nitride compound semiconductors are formed on a sapphire substrate.

DISCLOSURE OF THE INVENTION

However, when a Group III nitride compound semiconductor is formed on a sapphire substrate, misfit-induced dislocations occur due to difference between the lattice constant of sapphire and that of the semiconductor, resulting in poor device characteristics. Misfit-induced dislocations are threading dislocations which penetrate semiconductor layers in a longitudinal direction (i.e., in a direction vertical to the surface of the substrate), and Group III nitride compound semiconductors are accompanied by the problem that dislocations in amounts of approximately $10^9$ cm$^{-2}$ propagate therethrough. The aforementioned dislocations propagate through layers formed from Group III nitride compound semiconductors of different compositions, until they reach the uppermost layer. When such a semiconductor is incorporated in, for example, a light-emitting device, the device poses problems of unsatisfactory device characteristics in terms of threshold current of an LD, service life of an LED or LD, etc. On the other hand, when a Group III nitride compound semiconductor is incorporated in any of other types of semiconductor devices, because electrons are scattered due to defects in the Group III nitride compound semiconductor, the semiconductor device comes to have low mobility. These problems are not solved even when another type of substrate is employed.

The aforementioned dislocations will next be described with reference to a sketch of FIG. 18. FIG. 18 shows a substrate 91, a buffer layer 92 formed thereon, and a Group III nitride compound semiconductor layer 93 further formed thereon. Conventionally, the substrate 91 is formed of sapphire or a similar substance and the buffer layer 92 is formed of aluminum nitride (AlN) or a similar substance. The buffer layer 92 formed of aluminum nitride (AlN) is provided so as to relax misfit between the sapphire substrate 91 and the Group III nitride compound semiconductor layer 93. However, generation of dislocations is not reduced to zero. Threading dislocations 901 propagate upward (in a vertical direction with respect to the substrate surface) from dislocation initiating points 900, penetrating the buffer layer 92 and the Group III nitride compound semiconductor layer 93. When a semiconductor device is fabricated by stacking various types of Group III nitride compound semiconductors of interest on the Group III nitride compound semiconductor layer 93, threading dislocations further propagate upward, through the semiconductor device, from dislocation arrival points 902 on the surface of the Group III nitride compound semiconductor layer 93. Thus, according to conventional techniques, problematic propagation of dislocations cannot be prevented during formation of Group III nitride compound semiconductor layers.

The present invention has been accomplished in an attempt to solve the aforementioned problems, and an object of the present invention is to fabricate a Group III nitride compound semiconductor with suppressed generation of threading dislocations.

In order to attain the aforementioned object, the invention drawn to a first feature provides a method for fabricating a Group III nitride compound semiconductor on a substrate, which comprises removing at least a portion of the surface of the substrate so as to provide a trench/post or trench/mesa on the surface of the substrate, and epitaxially growing, vertically and laterally, a desired Group III nitride compound semiconductor on a not removed surface of said substrate, so as to cover the upper portion above said trench of the substrate, with a top surface of the surface of the substrate which was not removed serving as a seed, the not removed surface of the substrate being formed by removing a portion of the substrate so as to form an island-like structure such as a dot-like, stripe-shaped, or grid-like structure.

The invention drawn to a second feature provides a method for fabricating a Group III nitride compound semiconductor in which a Group III nitride compound semiconductor is grown on a buffer layer formed on the substrate, which comprises removing at least a portion of the surface of the substrate, so as to provide a trench/post on the surface of the substrate, forming a buffer layer on the substrate, and epitaxially growing, vertically and laterally, a desired Group III nitride compound semiconductor, so as to cover the upper portion of the trench of the trench/post of the substrate, with the buffer layer formed on the remaining surface of the substrate serving as a seed or nucleus for crystal growth, the buffer layer being formed in an island-like structure such as a dot-like, stripe-shaped, or grid-like structure.

The invention drawn to a third feature provides a method for fabricating a Group III nitride compound semiconductor in which a Group III nitride compound semiconductor is grown on a buffer layer formed on the substrate, which comprises removing at least a portion of the surface of the substrate, so as to provide a trench/post on the surface of the substrate, forming a buffer layer on the substrate, epitaxially growing, vertically, a Group III nitride compound semiconductor on the buffer layer so as to form a monocrystalline layer, and epitaxially growing, vertically and laterally, a desired Group III nitride compound semiconductor, so as to cover the upper portion of the trench of the trench/post of the substrate, with the monocrystalline layer of Group III nitride compound semiconductor formed on the buffer layer on the remaining surface of the substrate serving as a seed for crystal growth, the monocrystalline layer being formed in an island-like structure such as a dot-like, stripe-shaped, or grid-like structure.

The invention drawn to a fourth feature provides a method for fabricating a Group III nitride compound semiconductor in which a Group III nitride compound semiconductor is grown on a buffer layer formed on the substrate, which comprises forming a buffer layer on the substrate, removing at least a portion of the buffer layer and the surface of the substrate so as to provide a trench/post having a post or a mesa on which the buffer layer is formed on the surface of the substrate and a trench on which the buffer layer is not formed, and epitaxially growing, vertically and laterally, a desired Group III nitride compound semiconductor, so as to cover the upper portion of the trench of the trench/post of the substrate, with a buffer layer formed on the remaining surface of the substrate serving as a seed for crystal growth, the buffer layer being formed in an island-like structure such as a dot-like, stripe-shaped, or grid-like structure.

The invention drawn to a fifth feature provides a method for fabricating a Group III nitride compound semiconductor in which a Group III nitride compound semiconductor is grown on a buffer layer formed on the substrate, which comprises forming a buffer layer on the substrate, epitaxially growing, vertically, a Group III nitride compound semiconductor on the buffer layer so as to form a monocrystalline layer, removing at least a portion of the monocrystalline layer of Group III nitride compound semiconductor, the buffer layer, and the surface of the substrate so as to provide a trench/post having a post on which the monocrystalline layer of Group III nitride compound semiconductor and the buffer layer is formed on the surface of the substrate and a trench on which the monocrystalline layer of Group III nitride compound semiconductor and the buffer layer are not formed, and epitaxially growing, vertically and laterally, a desired Group III nitride compound semiconductor, so as to cover the upper portion of the trench of the trench/post of the substrate, with the monocrystalline layer of Group III nitride compound semiconductor formed on the buffer layer on the remaining surface of the substrate serving as a seed for crystal growth, the monocrystalline layer being formed in an island-like structure such as a dot-like, stripe-shaped, or grid-like structure.

The invention drawn to a sixth feature provides a method for fabricating a Group III nitride compound semiconductor in which a Group III nitride compound semiconductor is grown on the substrate, which comprises a surface treatment process of decreasing smoothness of at least a portion of the surface of the substrate and forming a portion on which a Group III nitride compound semiconductor layer is not sufficiently to be formed on the surface of the substrate, a process of growing the Group III nitride compound semiconductor on said treated substrate and forming a portion where a monocrystalline layer of Group III nitride compound semiconductor is sufficiently formed and a portion where a monocrystalline layer of Group III nitride compound semiconductor is not sufficiently formed, and a process of epitaxially growing, vertically and laterally, Group III nitride compound semiconductor, so as to cover the portion where the monocrystalline layer of Group III nitride compound semiconductor is not sufficiently formed, with the monocrystalline layer of Group III nitride compound semiconductor formed on the portion of the substrate whose surface smoothness is not decreased serving as a seed for crystal growth, the monocrystalline layer being formed in an island-like structure such as a dot-like, stripe-shaped, or grid-like structure.

The invention drawn to a seventh feature provides a method for fabricating a Group III nitride compound semiconductor in which a Group III nitride compound semiconductor is grown on a buffer layer formed on the substrate, which comprises a surface treatment process of decreasing smoothness of at least a portion of the surface of the substrate and forming a portion where a buffer layer is sufficiently to be formed on the surface of the substrate, a process of growing the buffer layer on the treated substrate and forming a portion on which a buffer layer is sufficiently formed and a portion where a buffer layer is not sufficiently formed, and a process of epitaxially growing, vertically and laterally, a desired Group III nitride compound semiconductor, so as to cover the portion where the buffer layer is not sufficiently formed, with the buffer layer formed on the portion of the substrate whose surface smoothness is not decreased serving as a seed for crystal growth, the buffer layer being formed in an island-like structure such as a dot-like, stripe-shaped, or grid-like structure.

The invention drawn to an eighth feature provides a method for fabricating a Group III nitride compound semiconductor in which a Group III nitride compound semiconductor is grown on a buffer layer formed on the substrate, which comprises a surface treatment process of decreasing smoothness of at least a portion of the surface of the substrate and forming a portion on which a buffer layer is sufficiently to be formed on the surface of the substrate, a process of growing the buffer layer on the treated substrate and forming a portion where a buffer layer is sufficiently formed and a portion where a buffer layer is not sufficiently formed, a process of forming a monocrystalline layer of Group III nitride compound semiconductor on the portion where the buffer layer is sufficiently formed, and a process of epitaxially growing, vertically and laterally, a desired Group III nitride compound semiconductor, so as to cover the portion where the buffer layer is not sufficiently formed, with the monocrystalline layer of the Group III nitride compound semiconductor formed on the buffer layer formed on the portion of the substrate whose surface smoothness is not decreased serving as a seed for crystal growth, the monocrystalline layer of the Group III nitride compound semiconductor being formed in an island-like structure such as a dot-like, stripe-shaped, or grid-like structure.

The invention drawn to a ninth feature provides a method for fabricating a Group III nitride compound semiconductor in which a Group III nitride compound semiconductor is grown on a buffer layer formed on the substrate, which comprises a process of forming a buffer layer on a substrate, a surface treatment process of decreasing smoothness of at least a portion of the surface of the buffer layer and forming a portion on which a monocrystalline layer of Group III nitride compound semiconductor is not sufficiently to be formed, a process of epitaxially growing, vertically and laterally, a desired Group III nitride compound semiconductor, so as to cover the portion where smoothness of the buffer layer is decreased, with the portion of the buffer layer whose surface smoothness is not decreased serving as a seed for crystal growth, the portion of the buffer layer being formed in island-like structure such as a dot-like, stripe-shaped, or grid-like structure.

In the invention drawn to a tenth feature provides a method for fabricating a Group III nitride compound semiconductor in which a Group III nitride compound semiconductor is grown on a buffer layer formed on the substrate, which comprises a process of forming a buffer layer on a substrate, a process of forming a first Group III nitride compound semiconductor on the buffer layer, a surface treatment process of decreasing smoothness of at least a portion of the first Group III nitride compound semiconductor and forming a portion on which a monocrystalline layer of a second Group III nitride compound semiconductor is not sufficiently to be formed, and a process of epitaxially growing, vertically and laterally, the second Group III nitride compound semiconductor, so as to cover the portion where smoothness of the first Group III nitride compound semiconductor is decreased, with the portion of the first Group III nitride compound semiconductor whose surface smoothness is not decreased serving as a seed for crystal growth, the portion of the first Group III nitride compound semiconductor being formed in an island-like structure such as a dot-like, stripe-shaped, or grid-like structure.

The invention drawn to an eleventh feature provides a Group III nitride compound semiconductor device, which is formed as an upper layer provided on a lateral-epitaxially grown portion of a Group III nitride compound semiconductor layer produced through a method for fabricating a Group III nitride compound semiconductor in connection with any one of the first to tenth features.

The invention drawn to a twelfth feature provides a Group III nitride compound semiconductor light-emitting device, which is produced by stacking, as an upper layer, a different Group III nitride compound semiconductor layer on a lateral-epitaxially grown portion of a Group III nitride compound semiconductor layer produced through a method for fabricating a Group III nitride compound semiconductor as recited in connection with any one of the first to tenth A features.

The invention drawn to a thirteenth feature provides a method for fabricating a Group III nitride compound semiconductor substrate including a method for fabricating a Group III nitride compound semiconductor as recited in connection with any one of the first to tenth features and removing substantially entire portions except for an upper layer formed on a portion provided through lateral epitaxial growth, to thereby obtain a Group III nitride compound semiconductor substrate.

The outline of an example of the method for fabricating a Group III nitride compound semiconductor of the present invention will next be described with reference to FIGS. 1-11.

[Invention According to First to Third Features]

As shown in FIG. 1(a), the substrate 1 is removed to thereby form an island-like structure such as a stripe-shaped, or grid-like structure, so as to provide a trench/post. Next, the buffer layer 2 is formed. The example when a buffer layer 2 comprises a portion 21 which is formed mainly on the upper surface of the post on the substrate 1 and a portion 22 which is formed on the bottom surface of the trench will next be described with reference to FIG. 1(b).

As shown in FIG. 1(b), the Group III nitride compound semiconductor 3 is epitaxially grown, vertically and laterally, with the buffer layer 2 comprising a portion 21 formed on the upper surface of the post and a portion 22 formed on the bottom surface of the trench of the substrate 1 serving as a seed for crystal growth, the substrate 1 having the trench of an island-like structure such as a stripe-shaped, or grid-like structure. Then, as shown in FIG. 1(c), the Group III nitride compound semiconductor 31, with the buffer layer 21 formed on the upper surface of the post serving as a seed or nucleus for crystal growth, can cover the upper portion of the trench before the Group III nitride compound semiconductor 32, which grows from the buffer layer 22 formed on the bottom surface of the trench, buries the trench. Further, by epitaxially growing, vertically or laterally, the Group III nitride compound semiconductor 3, the upper portion of the trench of the substrate is covered by the epitaxial growth as shown in FIG. 1(d), and a concentration of threading dislocations propagating in vertical direction extremely decreases.

When the rate that the Group III nitride compound semiconductor 31, which epitaxially grows in lateral direction from the buffer layer 21 formed on the upper surface of the post or mesa, coalescences to the lateral epitaxial growth layer starting from the upper surface of the post facing to each other is faster than the rate that the Group III nitride compound semiconductor 32, which epitaxially grows in vertical direction from the buffer layer 22 formed on the bottom surface of the trench, grows to the upper layer of the post, threading dislocations propagated from the buffer layer 22 formed on the bottom layer of the trench is remarkably suppressed in the upper portion of the thus-buried Group III nitride compound semiconductor 31, to thereby provide a crystal region of remarkably high quality. In this case, as shown in FIG. 1(d), the growth front of the Group III nitride compound semiconductor 32 which is grown from the buffer layer 22 formed on the bottom portion of the trench serving as a seed for crystal growth is not exposed at the surface but remains as cavities. And over the cavities, growth fronts of the Group III nitride compound semiconductor 31 grown from the buffer layer, formed on the upper layer of the post of both sides and serving as seeds for crystal growth, coalesce. The propagation of threading dislocations from the buffer layer 22 can be prevented at the cavities.

In FIG. 1(b), the buffer layer is hardly formed on the sidewalls of the trench of the substrate 1. Next, the case when the buffer layer is formed on the sidewalls of the trench of the substrate 1 as shown in FIGS. 2(a)-2(d) is explained hereinafter. As illustrated in FIG. 1(a), trenches/posts are formed by etching the substrate 1 (FIG. 2(a)). Then, as shown in FIG. 2(b), a Group III nitride compound semiconductor 3 epitaxially grows, vertically and laterally, with the buffer layer 2, which is formed on the upper surface of the post, the lower surface of the trench, and sidewalls of the trench of the substrate 1 formed to have an island-like structure such as a dot-like, stripe-shaped, or grid-like structure, serving as seeds for crystal growth. As shown in FIG. 2(c), the Group III nitride compound semiconductor 3, which epitaxially grows from the buffer layer 2 at the bottom surface and sidewalls of the trenches in vertical direction, buries the trenches, and the Group III nitride compound semiconductor 3 which grows from the upper surface of the posts of the buffer layer 2 in lateral direction grows so as to cover the trenches. Here "growing in vertical direction" from the sidewalls of the trenches means to grow in a direction normal to the sidewalls of the trench. Then, as illustrated in FIG. 1(d), the upper portion of the trench of the substrate is occupied by the Group III nitride compound semiconductor 3, which grows vertically from the buffer layer 2 formed on the sidewall of the trench and buries the trench, and the Group III nitride compound semiconductor 3, which grows laterally from the buffer layer 2 formed on the upper surface of the post. Threading dislocations of the Group III nitride compound semiconductor 3, which grows vertically on the buffer layer 2 formed on the sidewalls of the trench, in vertical direction is normal direction of the sidewall of the trench, and a concentration of threading dislocations propagating from the substrate surface (the upper surface of the post or the bottom surface of the trench) in vertical direction extremely decreases.

When the Group III nitride compound semiconductor 3 which epitaxially grows in lateral direction from the buffer layer formed on the upper surface of the post coalescences more rapidly compared with that the Group III nitride compound semiconductor 3 which epitaxially grows in vertical direction from the buffer layer 2 formed on the bottom surface of the trench grows to the upper layer of the post, the propagation of the threading dislocations from the buffer layer 2 in the upper portion of the thus-buried Group III nitride compound semiconductor 3 is remarkably suppressed, to thereby provide a crystal region of remarkably high quality. In this case, as shown in FIG. 2(d), growth fronts of the Group III nitride compound semiconductor 3 grown from the buffer layer 2 on the bottom surface of the trench, serving as seeds for crystal growth, are not come out to the surface but remain as cavities. And over the cavities, growth fronts of the Group III nitride compound semiconductor 3 grown from the buffer layer 2 on the post, serving as seeds for crystal growth, coalesce and the threading dislocations propagated from the buffer layer 2 on the bottom of the trench are prevented by this cavities.

The aforementioned rapid lateral epitaxial growth can be readily attained when the Group III nitride compound semiconductor layer 31 assumes a {11-20} plane as a growth front of the sidewall of the trench. During lateral epitaxial growth, at least an upper portion of the growth front may preferably remain a {11-20} plane. Of course the lateral epitaxial growth front cannot be limited to the {11-20} plane of the Group III nitride compound semiconductor.

The procedure described above can be applied to a Group III nitride compound semiconductor which epitaxially grows not on a buffer layer but directly on a substrate. FIGS. 3(a)-3(c) illustrate the procedure of removing a part of the substrate 1 to form trenches (FIG. 3(a)), growing the Group III nitride compound semiconductor 3 vertically and laterally (FIG. 3(b)), and covering the trench by lateral growth of a portion formed on the upper surface of the post with the Group III nitride compound semiconductor 3 serving as a seeds for crystal growth (FIG. 3(c)). And as shown in FIGS. 4(a)-4(d), a monocrystalline layer 3 of Group III nitride compound semiconductor (a monocrystalline layer 31 which is the upper layer of the post and a monocrystalline layer 32 which is the bottom layer of the trench) can be formed on the buffer layer 2 (a buffer layer 21 which is the upper layer of the post and a buffer layer 22 which is the bottom layer of the trench) (FIG. 4(b)), thereby covering the trench by lateral growth with the monocrystalline layer 31 of the upper layer of the post serving as a seed for crystal growth (FIGS. 4(c) and 4(d)).

[Invention According to Fourth and Fifth Features]

As shown in FIG. 5(a), the buffer layer 2 is formed on the substrate 1. Then as shown in FIG. 5(b), portions of the buffer layer 2 and the substrate 1 are removed, so as to provide trenches/posts. As shown in FIG. 5(c), a Group III nitride compound layer 31 is epitaxially grown, vertically and laterally, with mainly the buffer layer 2 serving as a seed for crystal growth. FIG. 5(c) illustrates the Group III nitride compound semiconductor 32 growing epitaxially from the bottom surfaces and sidewalls of the trenches/posts. When the rate that the Group III nitride compound semiconductor 31, which epitaxially grows in lateral direction from the buffer layer 2 formed on the upper surface of the post, coalescences to the lateral epitaxial growth front starting from the upper surface of the post facing to each other is faster than the rate that the Group III nitride compound semiconductor 32, which epitaxially grows in vertical direction from the buffer layer 2 formed on the bottom surface and the sidewall of the trench, grows to the upper layer of the post, threading dislocations propagated from the bottom layer of the trench is remarkably suppressed in the upper portion of the thus-buried Group III nitride compound semiconductor 31, to thereby provide a crystal region of remarkably high quality. In this case, as shown in FIG. 5(d), the growth layer of the Group III nitride compound semiconductor 32 which is grown from the buffer layer 2 formed on the bottom portion of the trench serving as a seed for crystal growth is not exposed at the surface but remains as cavities. And over the cavities, growth fronts of the Group III nitride compound semiconductor 31 grown from the buffer layer 2, formed on the upper layer of the post of both sides and serving as seeds for crystal growth, coalesce. The propagation of threading dislocations from the buffer layer 2 can be prevented at the cavities.

The aforementioned rapid lateral epitaxial growth can be readily attained when growth front of the Group III nitride compound semiconductor layer 31 parallel to the sidewall of the trench assumes a {11-20} plane. During lateral epitaxial growth, at least an upper portion of the growth front may preferably remain a {11-20} plane. Of course the lateral epitaxial growth front cannot be limited to the {11-20} plane of the Group III nitride compound semiconductor.

As shown in FIGS. 6(a)-6(d), a buffer layer 2 and a monocrystalline layer 31 of the Group III nitride compound semiconductor are formed (FIG. 6(a)), a trench is formed (FIG. 6(b)), to thereby covering the trench by lateral growth with the monocrystalline layer 31 of the upper layer of the post serving as a seed for crystal growth (FIGS. 6(c) and 6(d)).

[Invention According to Sixth to Eighth Features]

As shown in FIG. 7(a), rugged portions A which are roughened by e.g., etching or scribing, are formed on the surface of the substrate 1, so that the other portions of the substrate surface, which are not rugged, becomes an island-like structure such as a stripe-shaped or grid-like structure. Then a buffer layer 2 is formed on the substrate 1. Compared with a buffer layer 21 formed on the portion without ruggedness of the surface, the surface layer of the buffer layer 22 formed on the rugged portion A of the substrate surface cannot be a uniform monocrystalline layer and, moreover, its growth velocity is rather slow (FIG. 7(b)). When a Group III nitride compound semiconductor 3 is epitaxially grown vertically and laterally thereon, a monocrystalline layer is formed rapidly with the buffer layer 21, which is mainly formed on the portion of the substrate 1 without ruggedness of the surface, serving as a seed for crystal growth, and the buffer layer 22 formed on the rugged portion A is also covered by growing in lateral direction (FIG. 7(c)). By further growing the Group III nitride compound semiconductor 3 epitaxially in vertical and lateral directions, the buffer layer 22 formed on the rugged portion A is completely covered by the Group III nitride compound semiconductor 3 epitaxially grown in lateral direction with the buffer layer 21, which is mainly formed on the portion without ruggedness of the surface, serving as a seed for crystal growth. In this case, threading dislocations in vertical direction, generated from the buffer layer 22 which is formed on the rugged portion A, are not propagated to the Group III nitride compound substrate 3 which is grown thereon epitaxially in lateral direction.

As shown in FIG. 8(a), rugged portions A which are roughened by e.g., etching and etching or scribing, are formed on the surface of the substrate 1, so that the other portions of the substrate surface, which are not rugged, becomes an island-like structure such as a stripe-shaped or grid-like structure. Then a Group III nitride compound semiconductor 3, which grows epitaxially on the substrate 1, is formed thereon. Compared with a Group III nitride compound semiconductor 31 formed on the portion without ruggedness of the surface, the surface layer in a Group III nitride compound semiconductor 32 formed on the rugged portion A of the substrate surface cannot be a uniform monocrystalline layer and its growth velocity rather is slow (FIG. 8(b)). By further growing the Group III nitride compound semiconductor 3 epitaxially in vertical and lateral directions, the upper portion of the Group III nitride compound semiconductor 32 which is formed on the rugged portion A is completely covered by the Group III nitride compound semiconductor 31 growing epitaxially in lateral direction. In this case, threading dislocations in vertical direction, generated from the Group III nitride compound semiconductor 32 which is formed on the rugged portion A, are not propagated to the Group III nitride compound substrate 31 which is grown thereon epitaxially in lateral direction.

In FIGS. 7(a)-7(d), only a single Group III nitride compound semiconductor 3 epitaxially grows, vertically and laterally, on the substrate 1. Further, as shown in FIGS. 9(a)-9(d), the buffer layer 21 is formed on the portion without ruggedness of the surface, the Group III nitride compound semiconductor 31 is grown in vertical direction on the buffer layer 21, serving as a monocrystalline layer, and the Group III nitride compound semiconductor 32 can be grown in vertical and lateral directions thereon with the monocrystalline layer 31 of Group III nitride compound semiconductor serving as a seed for crystal growth.

[Invention According to Ninth and Tenth Features]

As shown in FIGS. 10(a)-10(d), after forming a buffer layer 2 on a substrate 1 (FIG. 10(a)) and deteriorating its surface by etching or scribing (FIG. 10(b)), a Group III nitride compound semiconductor 3 can be grown thereon in vertical and lateral directions (FIGS. 10(c) and 10(d)). As shown in FIGS. 11(a)-11(d), after forming a buffer layer 2 and a Group III nitride compound semiconductor 31 on a substrate 1 (FIG. 11(a)) and deteriorating its surface by etching or scribing (FIG. 11(b)), a Group III nitride compound semiconductor layer 33 can be grown thereon in vertical and lateral directions (FIGS. 11(c) and 11(d)). A Group III nitride compound semiconductor layer formed on the portion without ruggedness of the surface grows faster than that formed on the rugged portion of the substrate as shown in both FIG. 10(c) and FIG. 11(c). By growing the Group III nitride compound semiconductor layer in lateral direction with portions of it formed on the portion without ruggedness of the surface as seeds for crystal growth, the layer grows so as to cover the portions with rugged surface.

Through the procedure as described above there can be provided the Group III nitride compound semiconductor in which threading dislocations in propagated in vertical direction.

By forming a device element as an upper layer on a portion of a Group III nitride compound semiconductor layer that is formed through lateral epitaxial growth through the above step, there can be provided a semiconductor device having a layer containing few defects and endowed with high mobility (eleventh feature).

By stacking, as an upper layer, a light-emitting element on a portion of a Group III nitride compound semiconductor layer that is formed through the above step, there can be provided a light-emitting device endowed with improved service life and improved LD threshold value (twelfth feature).

By selectively separating, from the other layers, an upper layer formed on a portion of the Group III nitride compound semiconductor layer that is provided through lateral epitaxial growth through the above step, there can be produced a high-crystallinity Group III nitride compound semiconductor in which crystal defects such as dislocations are remarkably suppressed (thirteenth feature). In this connection, for the sake of convenience in manufacture, the expression "removing substantially entire portions" does not exclude the case in which a portion containing threading dislocations is present to some extent.

BRIEF DESCRIPTION OF THE DRAWINGS

FIGS. 1(a)-1(d) are a series of sectional views showing the steps of fabricating a Group III nitride compound semiconductor according to a first embodiment of the present invention;

BEST MODE FOR CARRYING OUT THE INVENTION

Figure 2A:
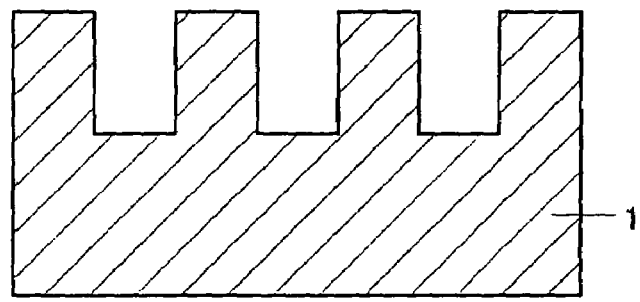
FIG. 2 is a series of sectional views showing the steps of fabricating another Group III nitride compound semiconductor of the present invention.
Figure 2B:
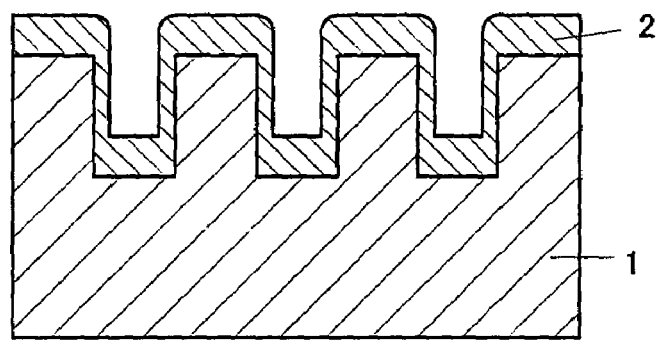
Figure 2C:
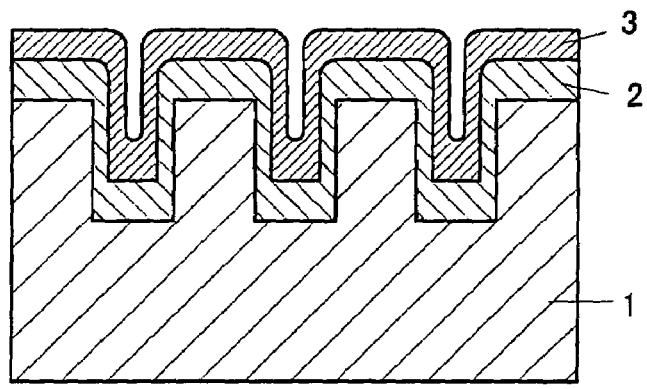
Figure 2D:
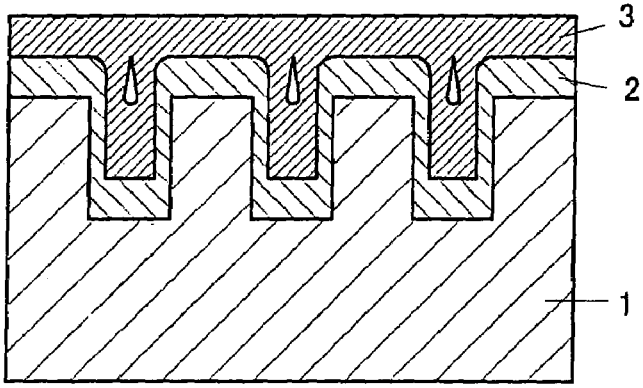
Figure 3A:
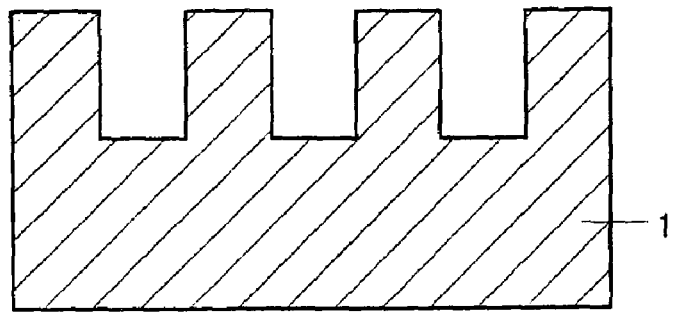
FIG. 3 is a series of sectional views showing the steps of fabricating a Group III nitride compound semiconductor according to a seventh embodiment of the present invention.
Figure 3B:
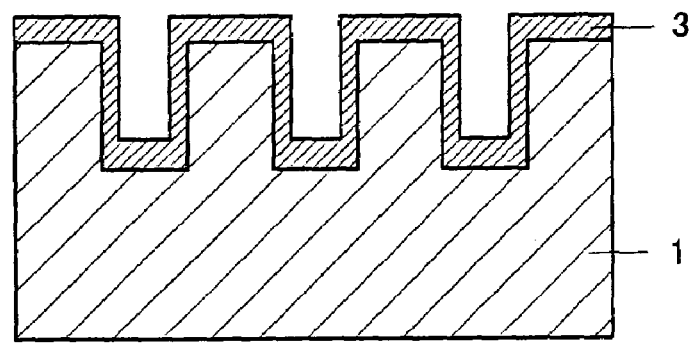
Figure 3C:
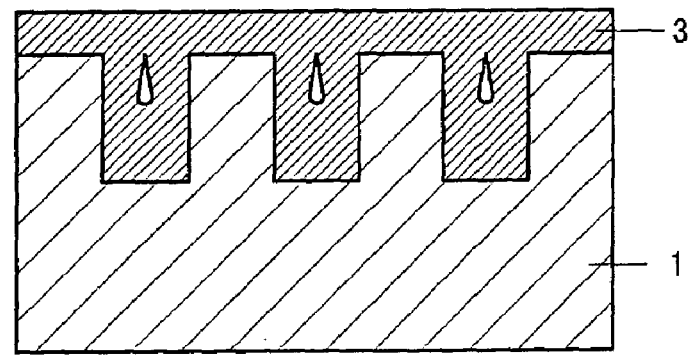
Figure 4A:
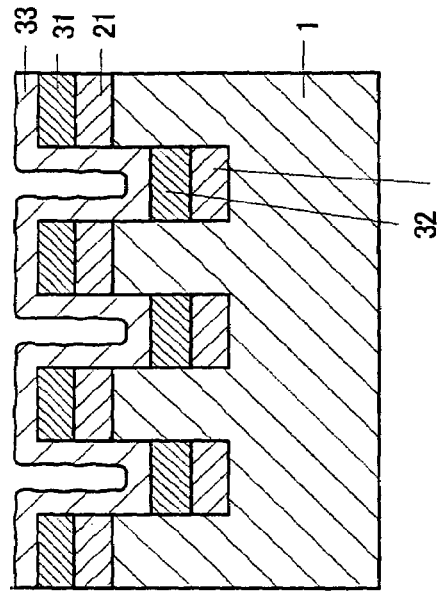
FIG. 4 is a series of sectional views showing the steps of fabricating another Group III nitride compound semiconductor of the present invention.
Figure 4B:
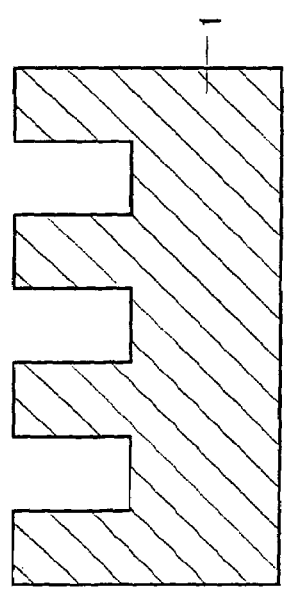
Figure 4C:
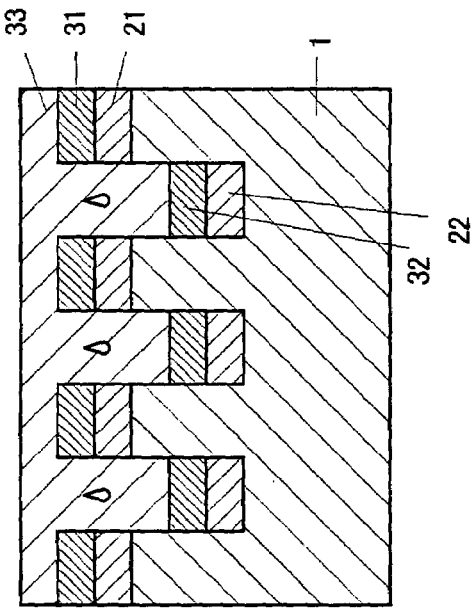
Figure 4D:
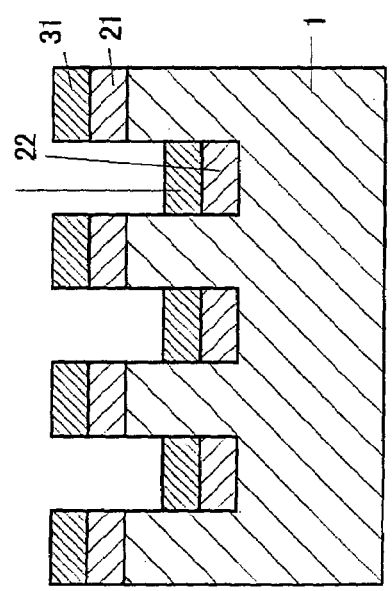
Figure 5A:
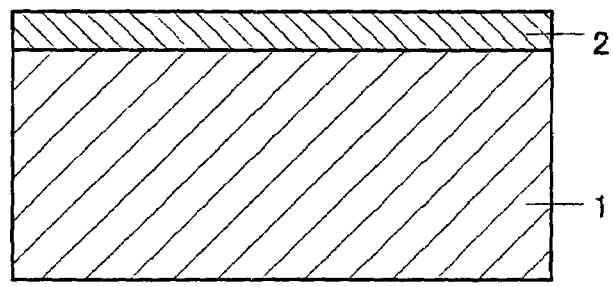
FIG. 5 is a series of sectional views showing the steps of fabricating a Group III nitride compound semiconductor light-emitting device according to a second embodiment of the present invention.
Figure 5B:
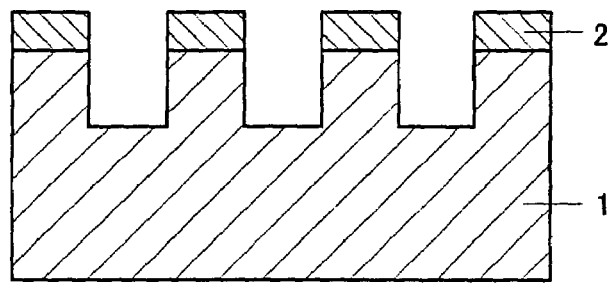
Figure 5C:
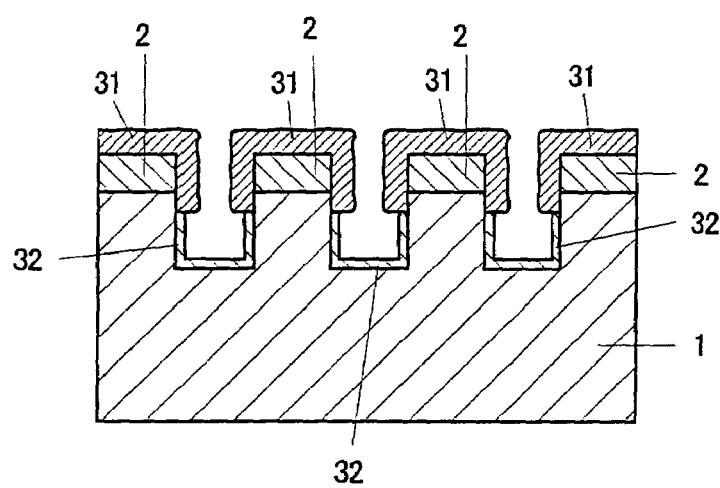
Figure 5D:
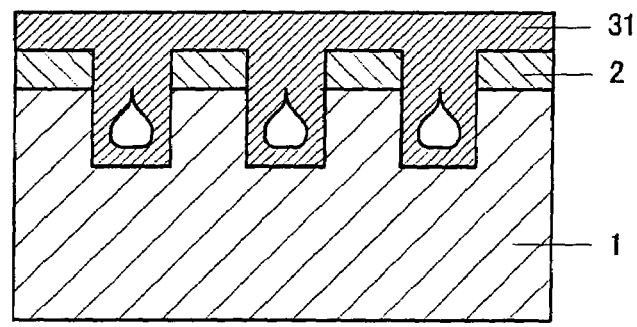
Figure 6C:
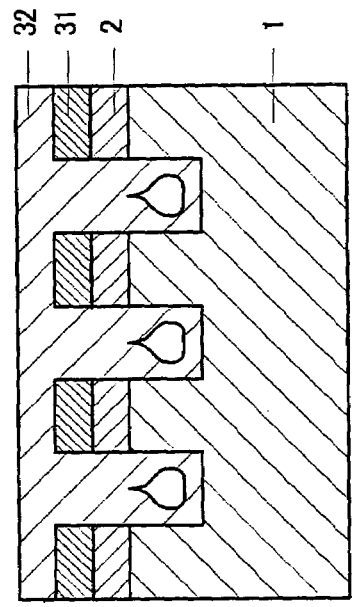
FIG. 6 is a series of sectional views showing the steps of fabricating another Group III nitride compound semiconductor of the present invention.
Figure 6A:
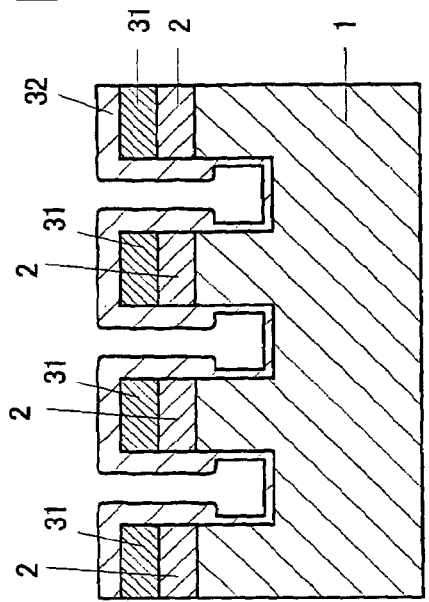
Figure 6D:
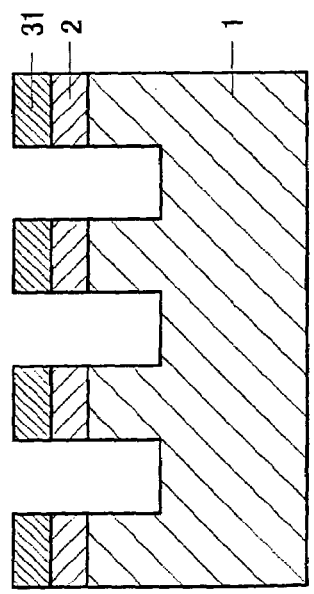
Figure 6B:
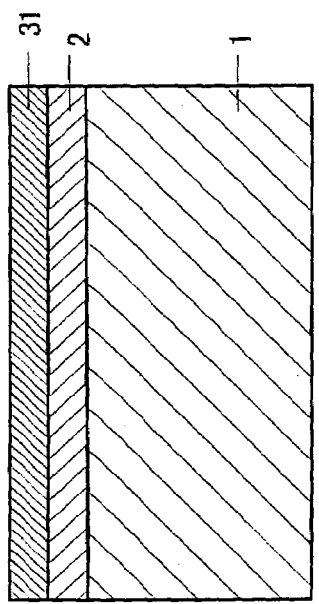
Figure 7A:
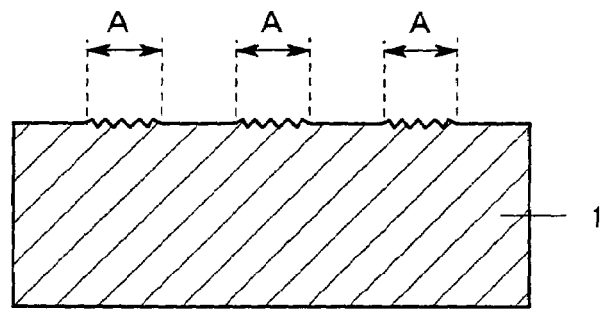
FIG. 7 is a series of sectional views showing the steps of fabricating a Group III nitride compound semiconductor according to the third embodiment of the present invention.
Figure 7B:
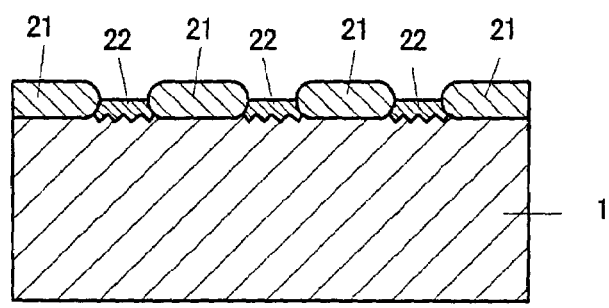
Figure 7C:
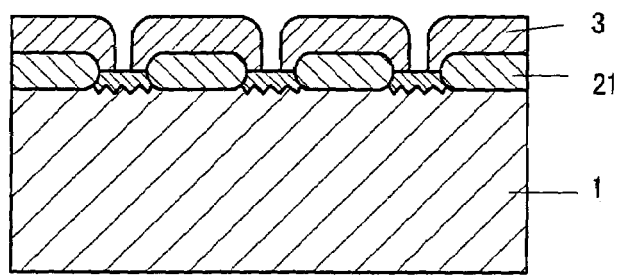
Figure 7D:
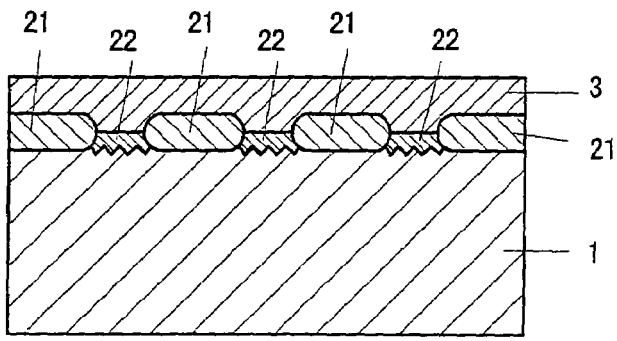

Embodiments of the present invention will next be described with reference to the drawings. The present invention has the above-described features and is not limited to the embodiments which will be described specifically.

Each of FIGS. 1-8 schematically shows a mode for carrying out a method for fabricating a Group III nitride compound semiconductor of the present invention. FIG. 1 shows an example in which a buffer layer 2 is not formed on a diced sidewall of a substrate 1. A trench is formed by dicing the substrate 1 (FIG. 1(*a*)), a buffer layer is formed (FIG. 1(*b*)), and a Group III nitride compound semiconductor layer 3 is epitaxially grown in lateral direction (FIG. (c)). Width and depth of dicing shown in FIG. 1(*a*) are determined so that the Group III nitride compound semiconductor layer 31, which grows vertically and laterally, with the buffer layer 21 formed on the upper surface of the post or mesa serving as a seed or nucleus for crystal growth, covers the upper portion of the trench before the Group III nitride compound semiconductor layer 32, which grows vertically with the buffer layer 2 formed at the bottom surface of the trench serving as a seed for crystal growth, buries the trench as described above. In FIG. 1(*c*), a lateral epitaxial growth front is assumed to be, for example, {11-20} planes. But in the present invention, it is not limited to an orientation of a growth front surface. Accordingly, the form of dicing and lateral epitaxial growth conditions are determined such that lateral growth of the Group III nitride compound semiconductor layer 31, with the buffer layer 21 formed on the upper surface of the post serving as a seed for crystal growth, coalescences at the upper portion of the trench formed by dicing before the vertical growth from the bottom surface of the trench buries the diced portion, whereby threading dislocations is suppressed in the regions of the Group III nitride compound semiconductor layer 31 formed on the upper portion of the trench obtained by dicing (FIG. 1(*d*)).

FIG. 2 illustrates structures when a buffer layer 2 is also formed at each sidewall of the trenches. Other effects to be yielded are similar to those described previously in relation to the case of FIG. 1.

FIG. 5 illustrates an embodiment in which dicing is carried out after forming the buffer layer 2 on the substrate 1. Without the buffer layer 2, the bottom surface and the sidewalls of the trenches formed on the substrate 1 does not grows vertically or grows at an extremely low velocity. Lateral growth, with the buffer layer 2 which is formed on the upper surface of the post serving as a seed for crystal growth, covers the trenches formed by dicing (FIGS. 5(*c*) and 5(*d*)). As described above, width and depth of dicing shown in FIG. 2(*a*) are determined such that lateral growth of the Group III nitride compound semiconductor layer 31, with the buffer layer 21 formed on the upper surface of the post serving as a seed for crystal growth, covers the upper portion of the trenches before the vertical growth of the Group III nitride compound semiconductor layer 32 from the bottom surface of the trench buries the diced portion. In FIG. 2(*c*), a lateral epitaxial growth front is assumed to be, for example, {11-20} planes. But in the present invention, it is not limited to an orientation of a growth front surface.

FIG. 7 shows a mode for forming the buffer layer 2 after roughening the surface of the substrate 1. Area of rugged portions A is determined such that a Group III nitride compound semiconductor layer 3, with a buffer layer 21 formed on the portions without ruggedness of the surface of the substrate 1 serving as a seed for crystal growth, epitaxially grows in vertical and lateral directions and covers a buffer layer 22, whose surface layer cannot be a uniform monocrystalline layer and which has a low growth velocity, formed on the rugged portions A.

Figure 8A:
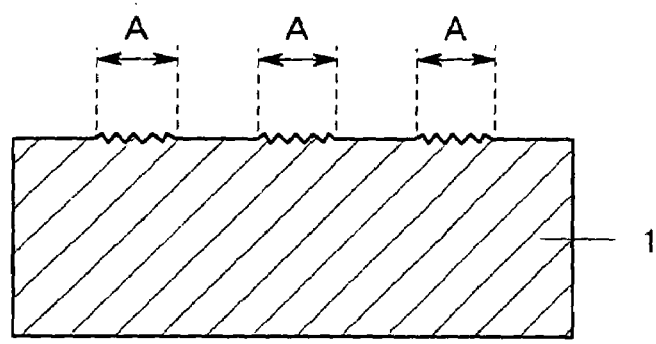
FIG. 8 is a series of sectional views showing the steps of fabricating another Group III nitride compound semiconductor of the present invention.
Figure 8B:
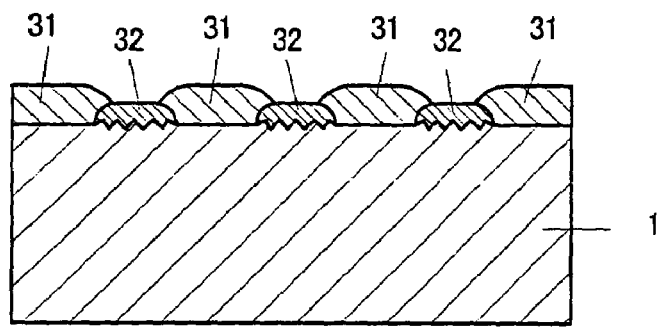
Figure 8C:
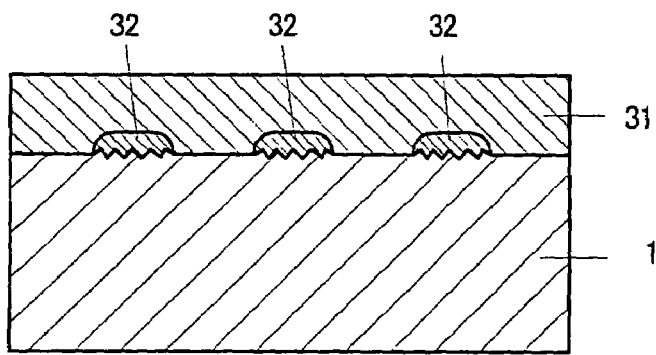
Figure 9A:
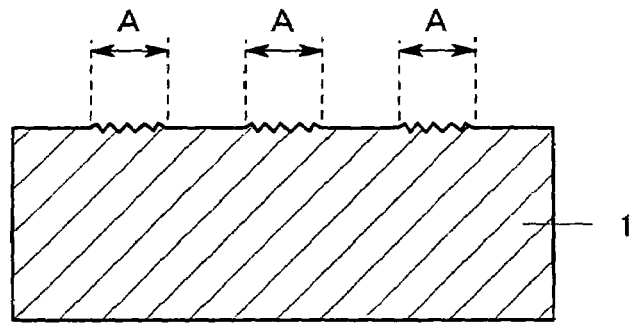
FIG. 9 is a series of sectional views showing the steps of fabricating another different Group III nitride compound semiconductor of the present invention.
Figure 9B:
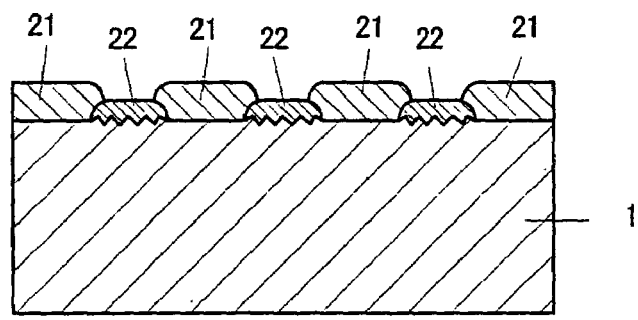
Figure 9C:
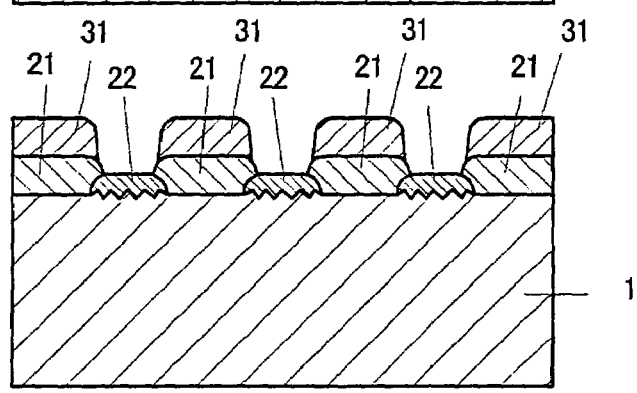
Figure 9D:
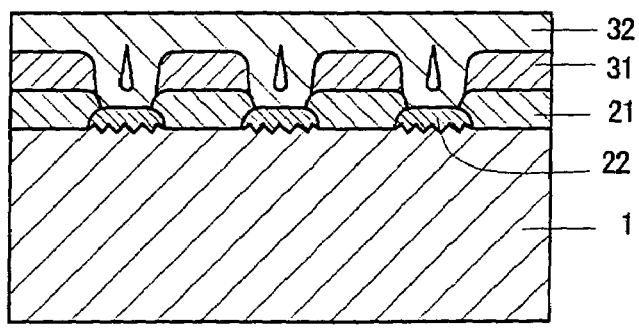
Figure 10A:
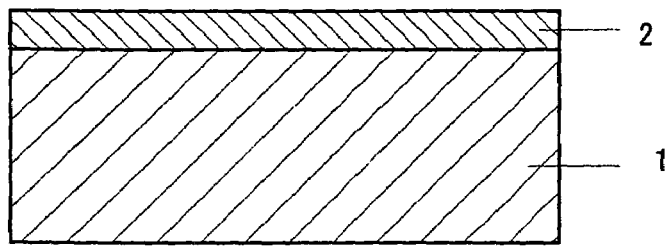
FIG. 10 is a series of sectional views showing the steps of fabricating another different Group III nitride compound semiconductor of the present invention.
Figure 10B:
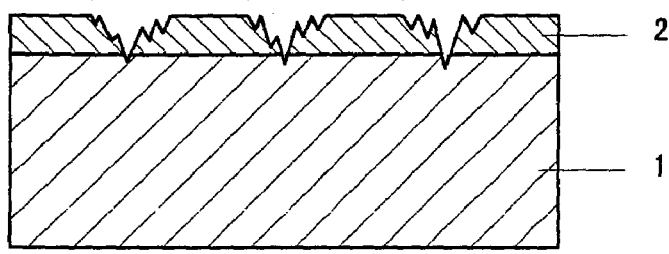
Figure 10C:
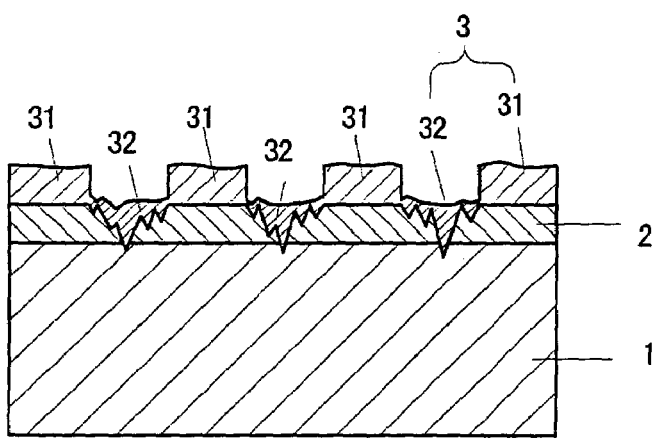
Figure 10D:
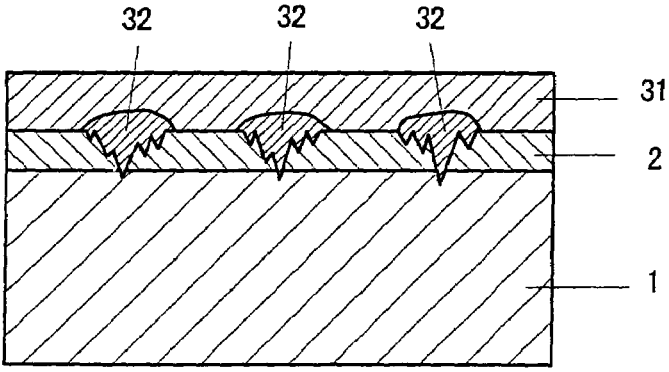
Figure 11A:
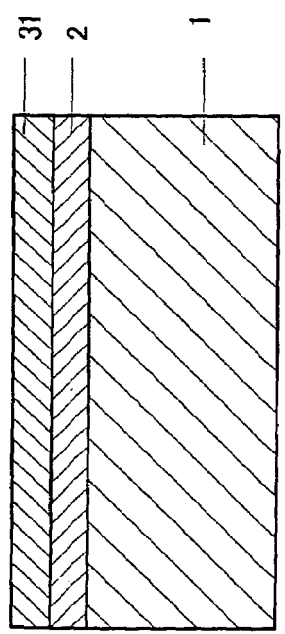
FIG. 11 is a series of sectional views showing the steps of fabricating another different Group III nitride compound semiconductor of the present invention.
Figure 11B:
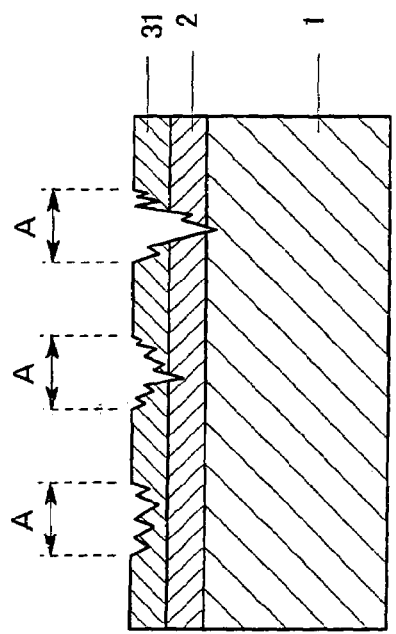
Figure 11C:
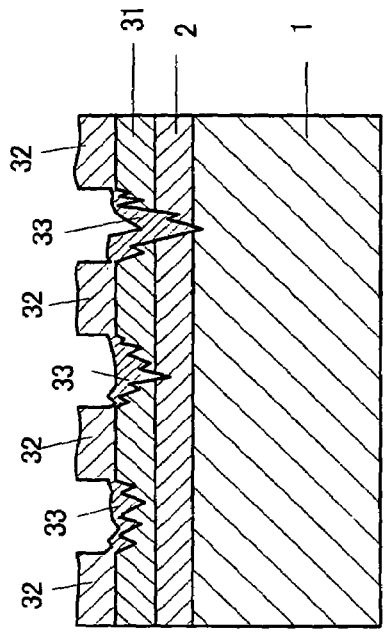
Figure 11D:
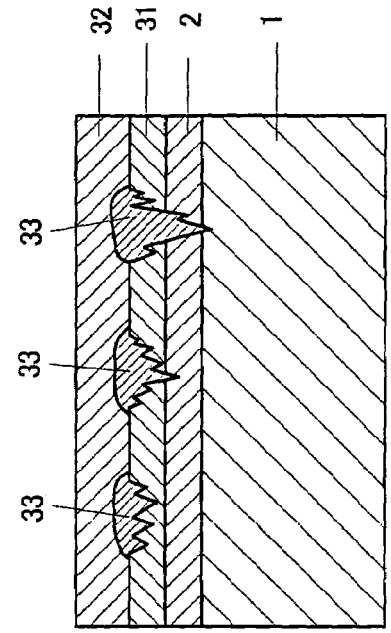
Figure 12A:
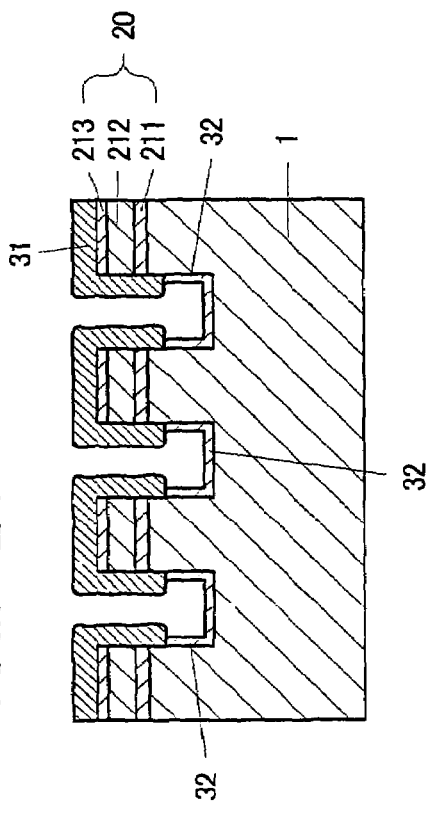
FIG. 12 is a series of sectional views showing the steps of fabricating a Group III nitride compound semiconductor according to a fourth embodiment of the present invention.
Figure 12B:
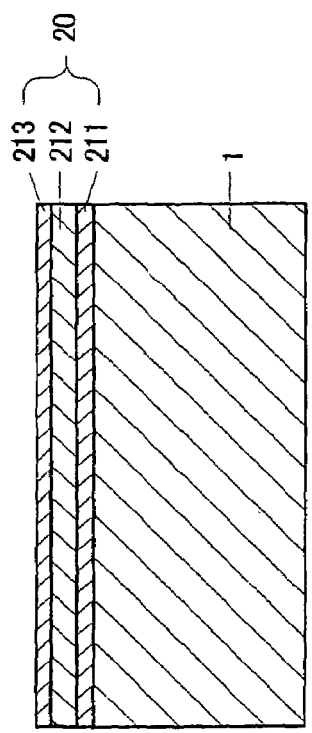
Figure 12C:
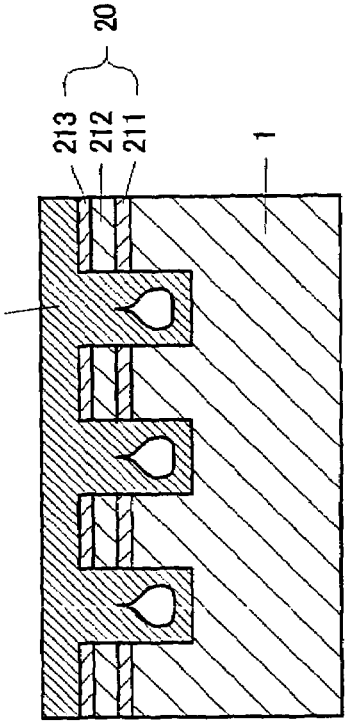
Figure 12D:
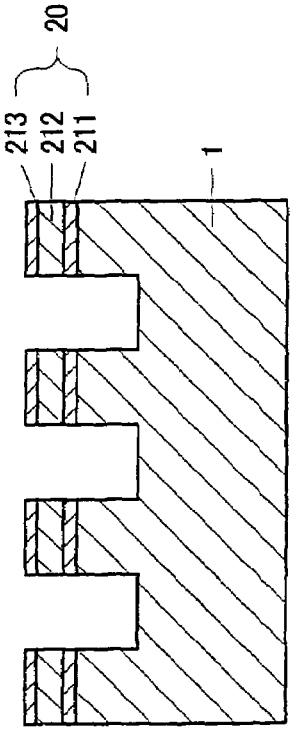

FIG. 8 shows a mode for forming a Group III nitride compound semiconductor directly after roughening the surface of the substrate 1. Area of rugged portions A is determined such that a Group III nitride compound semiconductor layer 31 formed on the portions without ruggedness of the surface of the substrate 1 epitaxially grows in vertical and lateral directions and covers a Group III nitride compound semiconductor layer 32, whose surface layer cannot be uniform monocrystalline layer and which has a low growth velocity, formed on the rugged portions A.

As an above-described mode for carrying out the invention allow selections to be described below.

When a laminate including a substrate and a Group III nitride compound semiconductor is to be formed, the substrate may be an inorganic crystalline substrate of sapphire, silicon (Si), silicon carbide (SiC), spinel ($MgAl_2O_4$), ZnO, MgO, or the like, and a Group III-V compound semiconductor, such as a gallium phosphide or gallium arsenide semiconductor, or a Group III nitride compound semiconductor, such as a gallium nitride (GaN) semiconductor, may be used.

A preferred process for forming a Group III nitride compound semiconductor layer is metal-organic chemical vapor deposition (MOCVD) or metal-organic vapor phase epitaxy (MOVPE). However, molecular beam epitaxy (MBE), halide vapor phase epitaxy (halide VPE), liquid phase epitaxy (LPE), or the like may be used. Also, individual layers may be formed by different growth processes.

When a Group III nitride compound semiconductor layer is to be formed on, for example, a sapphire substrate, in order to impart good crystallinity to the layer, a buffer layer is preferably formed for the purpose of correcting lattice mismatch with the sapphire substrate. When a substrate of another material is to be used, employment of a buffer layer is also preferred. A buffer layer is preferably of a Group III nitride compound semiconductor $Al_xGa_yIn_{1-x-y}N$ formed at low temperature ($0 \leq x \leq 1$, $0 \leq y \leq 1$, $0 \leq x+y \leq 1$), more preferably of $Al_xGa_{1-x}N$ ($0 \leq x \leq 1$). This buffer layer may be a single layer or a multi-component layer comprising layers of different compositions. A buffer layer may be formed at a low temperature of 380-420° C. or by MOCVD at a temperature of 1000-1180° C. Alternatively, an AlN buffer layer can be formed by a reactive sputtering process using a DC magnetron sputtering apparatus and, as materials, high-purity aluminum and nitrogen gas. Similarly, a buffer layer represented by the formula $Al_xGa_yIn_{1-x-y}N$ ($0 \leq x \leq 1$, $0 \leq y \leq 1$, $0 \leq x+y \leq 1$, arbitrary composition) can be formed. Furthermore, vapor deposition, ion plating, laser abrasion, or ECR can be employed. When a buffer layer is to be formed by physical vapor deposition, physical vapor deposition is performed preferably at 200-600° C., more preferably 300-500° C., most preferably 350-450° C. When physical vapor deposition, such as sputtering, is employed, the thickness of a buffer layer is preferably 100-3000 angstroms, more preferably 100-500 angstroms, most preferably 100-300 angstroms. A Group III nitride compound semiconductor layer and/or the upper layer of a Group III nitride compound semiconductor as a seed for lateral epitaxial growth can be a layer (underlying layer) comprising repetitions of unit of a buffer layer and a monocrystalline Group III nitride compound semiconductor layer may be formed. The underlying layer may most preferably comprises a monocrystalline layer as the uppermost layer, which may function as a seed of lateral epitaxial growth.

The present invention is substantially applicable even when the composition of a buffer layer, a Group III nitride compound semiconductor layer functioning as a seed of lateral epitaxial growth, a layer which epitaxially grows in lateral direction, and/or a Group III nitride compound semiconductor which is placed at the upper surface, are such that a portion of Group III elements are replaced with boron (B) or thallium (Tl) or a portion of nitrogen (N) atoms are replaced with phosphorus (P), arsenic (As), antimony (Sb), or bismuth (Bi). Also, the buffer layer and the Group III nitride compound semiconductor may be doped with any one of these elements to such an extent as not to appear in the composition thereof. For example, a Group III nitride compound semiconductor which is represented by $Al_xGa_{1-x}N$ ($0 \leq x \leq 1$) and which does not contain indium (In) and arsenic (As) may be doped with indium (In), which is larger in atomic radius than aluminum (Al) and gallium (Ga), or arsenic (As), which is larger in atomic radius than nitrogen (N), to thereby improve crystallinity through compensation, by means of compression strain, for crystalline expansion strain induced by dropping off of nitrogen atoms. In this case, since acceptor impurities easily occupy the positions of Group III atoms, p-type crystals can be obtained as grown. Through the thus-attained improvement of crystallinity combined with the features of the present invention, threading dislocation can be further reduced to approximately $1/100$ to $1/1000$. In the case where a light-emitting device is a target product, use of a binary or ternary Group III nitride compound semiconductor is preferred.

When an n-type Group III nitride compound semiconductor layer is to be formed, a Group IV or Group VI element, such as Si, Ge, Se, Te, or C, can be added as an n-type impurity. A Group II or Group IV element, such as Zn, Mg, Be, Ca, Sr, or Ba, can be added as a p-type impurity. The same layer may be doped with a plurality of n-type or p-type impurities or doped with both n-type and p-type impurities.

Preferably, the front of lateral epitaxial growth is perpendicular to a substrate. However, lateral epitaxial growth may progress while slant facets with respect to the substrate are maintained.

Preferably, lateral epitaxial growth progresses such that at least an upper portion of the front of lateral epitaxial growth is perpendicular to the surface of a substrate. More preferably, growth fronts are {11-20} planes of a Group III nitride compound semiconductor.

The depth and width of trenches to be etched is determined such that lateral epitaxial growth fills the trenches. Conditions of etching are determined while utilizing the phenomenon that vertical growth from the surface of a substrate or from a different layer does not take place or is very slow in at least the initial stage of growth.

When the crystal orientation of a Group III nitride compound semiconductor layer to be formed on a substrate can be predicted, masking or dicing sidewalls of the trenches formed at the substrate in the form of stripes parallel to the a-plane ({11-20} plane) or the m-plane ({1-100} plane) of the Group III nitride compound semiconductor layer is favorable. The aforementioned stripe or mask patterns may be island-like or grid-like or may assume other forms. The front of lateral epitaxial growth may be perpendicular or oblique to the surface of a substrate. In order for the a-plane; i.e., the {11-20} plane, of a Group III nitride compound semiconductor layer to become the front of lateral epitaxial growth, the longitudinal direction of stripes must, for example, be perpendicular to the m-plane; i.e., the {1-100} plane, of the Group III nitride compound semiconductor layer. For example, when the surface of a substrate is the a-plane or the c-plane of sapphire, the m-plane of sapphire usually matches the a-plane of a Group III nitride compound semiconductor layer formed on the substrate. Thus, dicing is performed according to the arrangement of the planes. In the case of a point-like, grid-like, or island-like etching, planes that define an outline (sidewalls) are preferably {11-20} planes of the Group III nitride compound semiconductor layer which is formed as an upper layer.

An etching mask may comprise an oxide or nitride, such as silicon oxide ($SiO_2$), silicon nitride ($Si_3N_4$), titanium oxide ($TiO_x$), or zirconium oxide ($ZrO_x$); or may assume the form of a multi-layer film thereof. The etching mask may be formed by a vapor phase growth process, such as vapor deposition, sputtering, or CVD, or other processes.

Reactive ion beam etching (RIE) is preferred, but any other etching process may be employed. Alternative to etching, trenches may be formed by using a mechanical process such as scribing can be used. Any other arbitrary process, for example, scribing, using a diamond cutter, can be also used to roughen the substrate.

A semiconductor device, such as an FET or a light-emitting device, can be formed on the above-described Group III nitride compound semiconductor having regions where threading dislocation is suppressed, throughout the entire region or mainly on the regions where threading dislocation is suppressed. In the case of a light-emitting device, a light-emitting layer assumes a multi-quantum well (MQW) structure, a single-quantum well (SQW) structure, a homo-structure, a single-hetero-structure, or a double-hetero-structure, or may be formed by means of, for example, a pin junction or a pn junction.

The above-described Group III nitride compound semiconductor having regions where threading dislocation is suppressed can be formed into a Group III nitride compound semiconductor substrate through removal of, for example, the substrate 1, the buffer layer 2, and portions of the Group III nitride compound semiconductor where threading dislocation is not suppressed. The thus-formed substrate allows formation of a Group III nitride compound semiconductor device thereon or may be used as a substrate for forming a greater Group III nitride compound semiconductor crystal. The removal can be performed by mechanochemical polishing or any other appropriate process.

After treating the substrate and forming regions with less threading dislocations, regions with less threading dislocations are formed on the upper portion of the regions with much threading dislocations. That is also included in the present invention as an alternative example. For example, according to the first to fourth features of the present invention, a mask is formed on the regions with much threading dislocations, which are formed in the Group III nitride compound semiconductor layer comprising regions with less threading dislocations and regions with much threading dislocations. Then epitaxially growing the Group III nitride compound semiconductor layer in lateral direction with the surface of the regions with less threading dislocations, on which no mask is formed, serving as a seed for crystal growth, and covering the upper portion of the mask, thereby obtaining a Group III nitride compound semiconductor layer with generally less threading dislocations. As an other alternative, a second lateral epitaxial growth on the upper portion of the regions with much threading dislocations may be carried on.

The present invention will next be described with reference to specific embodiments. The embodiments will be described while mentioning a method for fabricating a light-emitting device. However, the present invention is not limited to the embodiments to be described below. The present invention discloses a method for fabricating a Group III nitride compound semiconductor applicable to fabrication of any device.

In all the embodiments to be described below, the Group III nitride compound semiconductor of the present invention was fabricated by metal-organic vapor phase epitaxy (hereinafter called "MOVPE"). Typical gases used include ammonia ($NH_3$), carrier gas ($H_2$ or $N_2$), trimethylgallium ($Ga(CH_3)_3$, hereinafter called "TMG"), trimethylaluminum ($Al(CH_3)_3$, hereinafter called "TMA"), trimethylindium ($In(CH_3)_3$, hereinafter called "TMI"), and cyclopentadienylmagnesium ($Mg(C_5H_5)_2$, hereinafter called "$Cp_2Mg$").

First Embodiment

A monocrystalline sapphire substrate 1 was prepared such that the a-plane thereof cleaned through organic cleaning and heat treatment serves as the main surface thereof. By carrying out dicing, trenches each having a width of 10 μm and a depth of 10 μm were formed at 10 μm of intervals in a stripe pattern. Next, temperature was set to 400° C., and $H_2$ (10 L/min), $NH_3$ (5 L/min), and TMA (20 μmol/min) were supplied for approximately 3 minutes to thereby form, on the sapphire substrate 1, a buffer layer 2 of AlN having a thickness of approximately 40 nm. The buffer layer 2 was formed mainly on the upper surface and the bottom surface of the trenches of the substrate 1.

Next, while the temperature of the sapphire substrate 1 was maintained at 1150° C., $H_2$ (20 L/min), $NH_3$ (10 L/min), and TMG (5 μmol/min) were introduced to thereby form a GaN layer 3 through vertical and lateral epitaxial growth. At this time, lateral epitaxial growth from the buffer layer 21, which was mainly formed on the upper surface of the posts, filled the trenches and thus establishing a flat top surface (FIG. 1(c)). Subsequently, $H_2$ (20 L/min), $NH_3$ (10 L/min), and TMG (300 μmol/min) were introduced to thereby grow the GaN layer 3 such that the thickness of the GaN layer 3 becomes 10 μm of thickness. In contrast to portions of the GaN layer 3 formed above the top surfaces of the posts, portions of the GaN layer 32 formed above the bottoms of the trenches extending as deep as 10 μm through the substrate 1 exhibited significant suppression of threading dislocation.

Second Embodiment

A monocrystalline sapphire substrate 1 was prepared such that the a-plane thereof cleaned through organic cleaning and heat treatment serves as the main surface thereof. Temperature was dropped to 400° C., and $H_2$ (10 L/min), $NH_3$ (5 L/min), and TMA (20 μmol/min) were supplied for approximately 3 minutes to thereby form, on the sapphire substrate 1, an AlN layer (first buffer layer) 2 having a thickness of approximately 40 nm. Next, by carrying out dicing, trenches each having a width of 10 μm and a depth of 10 μm were formed at 10 μm of intervals in a stripe pattern. The buffer layer 2 remained only on the upper surface of posts of the substrate 1 (FIG. 5(b)).

Next, while the temperature of the sapphire substrate 1 was maintained at 1150° C., $H_2$ (20 L/min), $NH_3$ (10 L/min), and TMG (5 μmol/min) were introduced to thereby form a GaN layer 3 was formed through vertical and lateral epitaxial growth. At this time, lateral epitaxial growth from the buffer layer 2, which was mainly formed on the upper surface of the posts, filled the trenches and thus establishing a flat top surface (FIGS. 5(c) and 5(d)). Subsequently, $H_2$ (20 L/min), $NH_3$ (10 L/min), and TMG (300 μmol/min) were introduced to thereby grow the GaN layer 31 such that the thickness of the GaN layer 31 becomes 10 μm. In contrast to portions of the GaN layer 31 formed above the top surfaces of the posts, portions formed above the bottoms of the trenches extending as deep as 10 μm through the substrate 1 exhibited significant suppression of threading dislocation.

Third Embodiment

A monocrystalline sapphire substrate 1 was prepared such that the a-plane thereof cleaned through organic cleaning and heat treatment serves as the main surface thereof. Then the surface of the substrate 1 was selectively dry-etched in a short time by reactive ion beam etching (RIE) to have stripe-shaped ruggedness each having a width of 10 μm at intervals of 10 μm. Next, while the temperature of the sapphire substrate 1 was maintained at 400° C., $H_2$ (10 L/min), $NH_3$ (5 L/min), and TMA (20 μmol/min) were introduced for 3 minutes to thereby form an AlN buffer layer 2 having a thickness of about 40 nm. The surface morphology of the rugged portion 22 was different from that of the smooth portion 21 of the buffer layer 2 (FIG. 7(b)).

Next, while the temperature of the substrate 1 was maintained at 1150° C., $H_2$ (20 L/min), $NH_3$ (10 L/min), and TMA (5 μmol/min) were introduced to thereby form a GaN layer 3 through vertical and lateral epitaxial growth. At this time, mainly the lateral epitaxial growth from the smooth portion 21 covers the rugged portion 22 of the buffer layer 2, thereby obtain a flat surface (FIGS. 7(c) and 7(d)). Then $H_2$ (20 L/min), $NH_3$ (10 L/min), and TMG (300 μmol/min) were introduced to thereby form a GaN layer 3 having a thickness of 3 μm. In contrast to portions of the GaN layer 3 formed above the smooth portion, portions of the GaN layer 3 formed above the rugged portion on the substrate 1 exhibited significant suppression of threading dislocation.

Fourth Embodiment

The present embodiment used an underlying layer comprising repetitions of a buffer layer and a monocrystalline Group III nitride compound semiconductor layer as shown in FIG. 12. A monocrystalline sapphire substrate 1 was prepared such that the a-plane thereof cleaned through organic cleaning and heat treatment serves as the main surface thereof. Temperature was dropped to 400° C., and $H_2$ (10 L/min), $NH_3$ (5 L/min), and TMA (20 μmol/min) were supplied for approximately 3 minutes to thereby form, on the sapphire substrate 1, a first AlN layer 211 having a thickness of approximately 40 nm. Next, while the temperature of the sapphire substrate 1 was maintained at 1000° C., $H_2$ (20 L/min), $NH_3$ (10 L/min), and TMG (300 μmol/min) were introduced to thereby form a GaN layer 212 having a thickness of approximately 0.3 μm. Next, the temperature was dropped to 400° C., and $H_2$ (10 L/min), $NH_3$ (5 L/min), and TMA (20 μmol/min) were supplied for approximately 3 minutes to thereby form a second AlN layer 213 having a thickness of approximately 40 nm. Thus was formed an underlying layer 20 comprising the first AlN layer 211 having a thickness of approximately 40 nm, the GaN layer 212 having a thickness of approximately 0.3 μm, and the second AlN layer 213 having a thickness of approximately 40 nm.

Next, trenches are formed by dicing in a manner similar to that of the second embodiment. The trenches were caused to extend by a depth of 10 μm into the sapphire substrate 1. Next, while the temperature of the sapphire substrate 1 was maintained at 1150° C., $H_2$ (20 L/min), $NH_3$ (10 L/min), and TMG (5 μmol/min) were introduced to thereby form a GaN layer 31 through lateral epitaxial growth. Lateral epitaxial growth was performed while the underlying layer 20 formed at the top portions of the posts served as seeds for crystal growth, thereby filling the trenches and thus establishing a flat top surface. Subsequently, $H_2$ (20 L/min), $NH_3$ (10 L/min), and TMG (300 μmol/min) were introduced to thereby grow the GaN layer 31 such that the GaN layer 31 has a thickness of 10 μm. In contrast to portions of the GaN layer 31 formed above the top surfaces of the posts, portions of the GaN layer 31 formed above the 10 μm-depth portions of the trenches formed in the sapphire substrate 1 exhibited significant suppression of threading dislocation.

Fifth Embodiment

Figure 13:
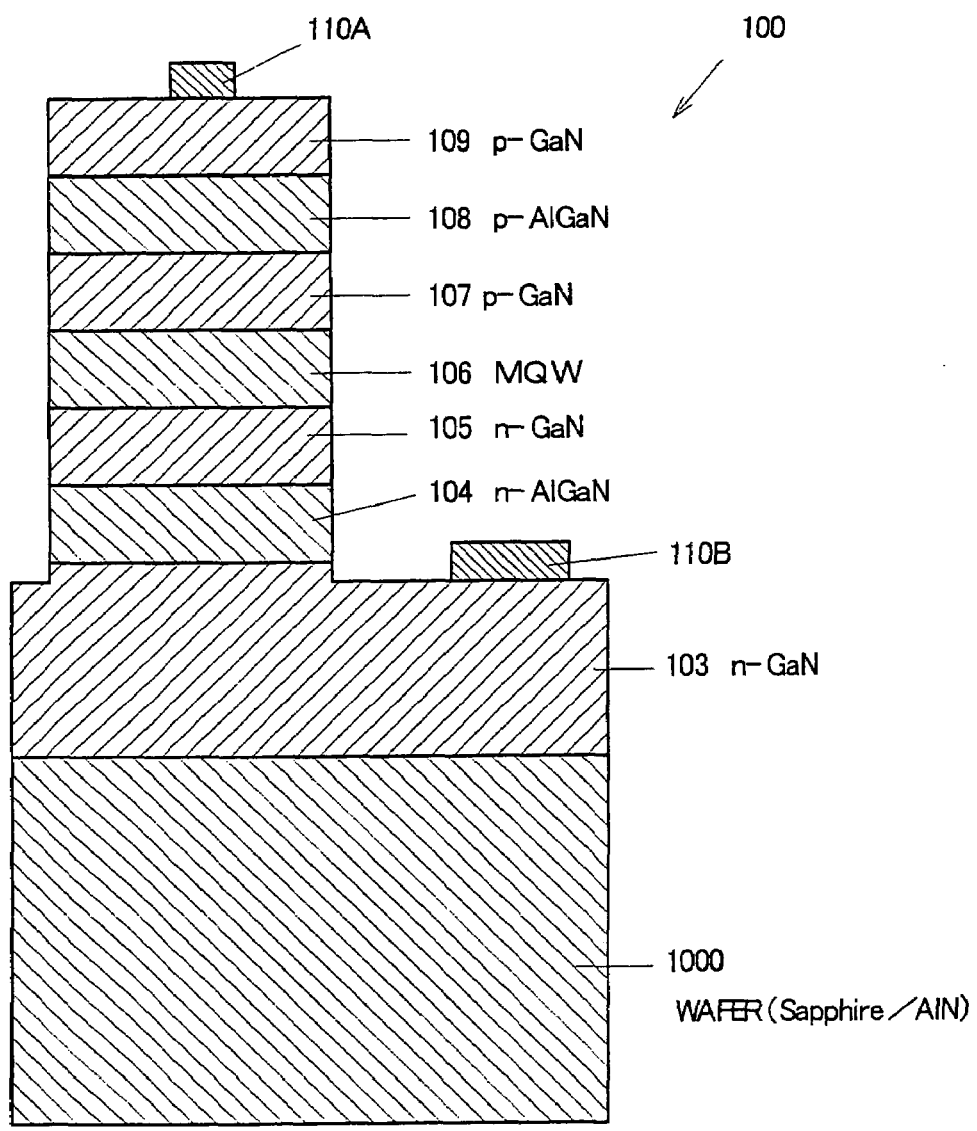
FIG. 13 is a sectional view showing a Group III nitride compound semiconductor light-emitting device according to a fifth embodiment of the present invention.

On a wafer formed in a manner similar to that of the first embodiment, a laser diode (LD) 100 shown in FIG. 13 was formed in the following manner. Notably, in formation of the GaN layer 3, silane ($SiH_4$) was introduced so as to form a silicon (Si)-doped n-type GaN layer serving as the GaN layer 3. For the sake of simplified illustration, the drawing merely illustrates a wafer 1000 to inclusively represent the trenched sapphire substrate 1, the buffer layer 2 which is formed on the upper surface of the posts and the bottom surface of the trenches, and the GaN layer which fills the trenches as well as illustrates a GaN layer 103 to represent the remaining portion of the GaN layer 3.

On the n-type GaN layer 103 formed on the wafer layer 1000 comprising the trenched sapphire substrate 1, the AlN buffer layer 2, and the GaN layer 3, an n-clad layer 104 of silicon (Si)-doped $Al_{0.08}Ga_{0.92}N$, an n-guide layer 105 of silicon (Si)-doped GaN, an MQW-structured light-emitting layer 106, a p-guide layer 107 of magnesium (Mg)-doped GaN, a p-clad layer 108 of magnesium (Mg)-doped $Al_{0.08}Ga_{0.92}N$, and a p-contact layer 109 of magnesium (Mg)-doped GaN were formed. Next, an electrode 110A of gold (Au) was formed on the p-contact layer 109. Etching was partially performed until the three-layered GaN layer 103 consisting of the two-layered GaN layer and the n-type GaN layer was exposed. On the exposed GaN layer 103, an electrode 110B of aluminum (Al) was formed. The thus-formed laser diode (LD) exhibited the significant improvement of device life and light-emitting efficiency.

Sixth Embodiment

Figure 14:
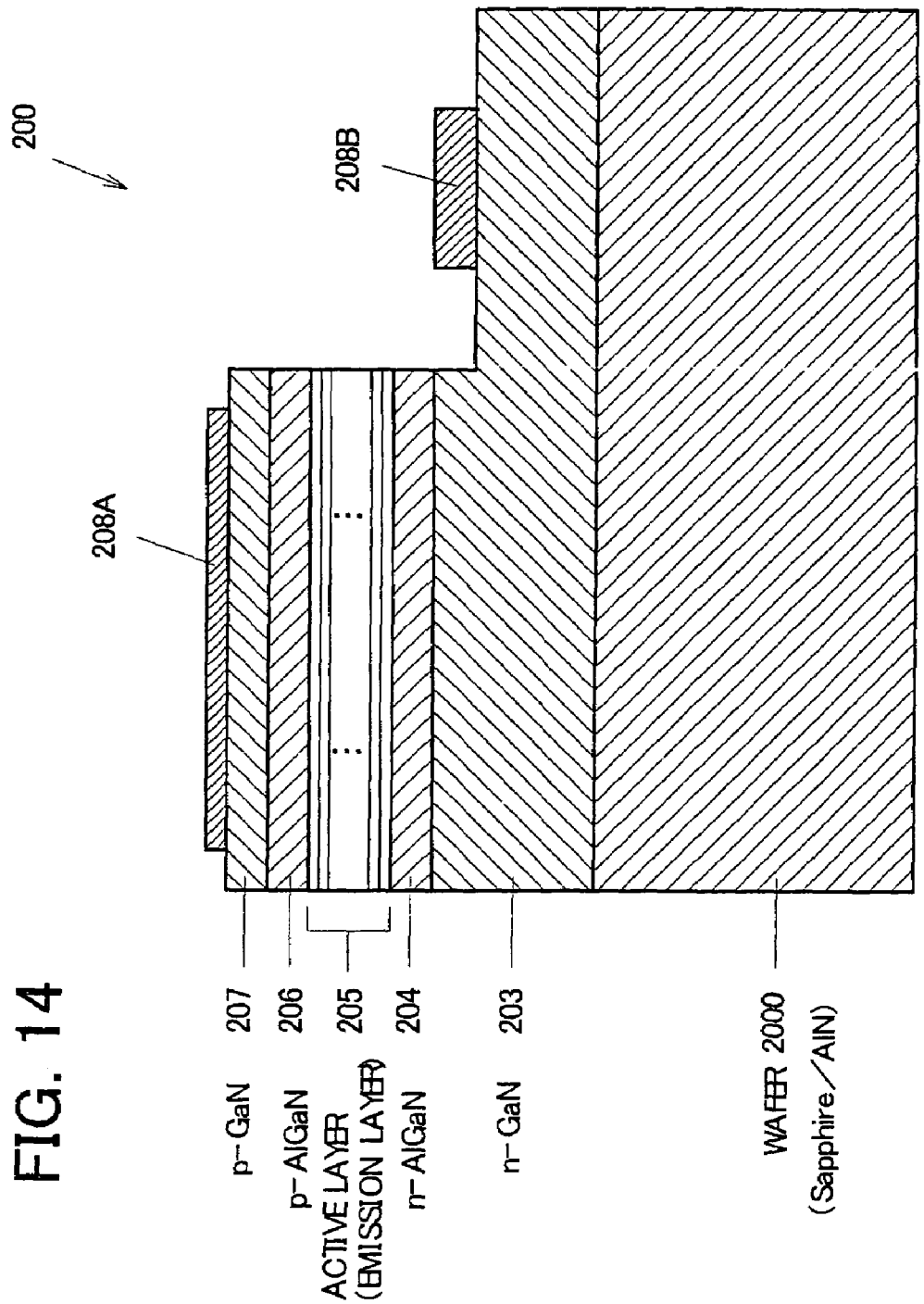
FIG. 14 is a sectional view showing a Group III nitride compound semiconductor light-emitting device according to a sixth embodiment of the present invention.

On a wafer formed in a manner similar to that of the first embodiment, a light-emitting diode (LED) 200 shown in FIG. 14 was formed in the following manner. When the GaN layer 3 is formed, silane ($SiH_4$) was introduced so that the GaN layer 3 comprises Si-doped n-type GaN. For the sake of simplified illustration, the drawing merely illustrates a wafer 2000 to inclusively represent the trenched sapphire substrate 1, the buffer layer 2 which is formed on the upper surface of the posts and the bottom surface of the trenches, and the GaN layer which fills the trenches as well as illustrates a GaN layer 203 to represent the remaining portion of the GaN layer 3.

On the n-type GaN layer 203 formed on the wafer layer 2000 comprising the trenched sapphire substrate 1, the AlN buffer layer 2, and the GaN layer 3 which fills the trenches, an n-clad layer 204 of silicon (Si)-doped $Al_{0.08}Ga_{0.92}N$, a light-emitting layer 205, a p-clad layer 206 of magnesium (Mg)-doped $Al_{0.08}Ga_{0.92}N$, and a p-contact layer 207 of magnesium (Mg)-doped GaN were formed. Next, an electrode 208A of gold (Au) was formed on the p-contact layer 207. Etching was partially performed until the two-layered GaN layer 203 consisting of the GaN layer and the n-type GaN layer was exposed. On the exposed GaN layer 203, an electrode 208B of aluminum (Al) was formed. The thus-formed light-emitting diode (LED) exhibited the significant improvement of device life and light-emitting efficiency.

Seventh Embodiment

The present embodiment used a silicon (Si) substrate. The Si substrate 301 was etched in a stripe pattern and trenches each having a width of 10 μm and a depth of 10 μm were formed at 10 μm of intervals in a stripe pattern. Next, while the temperature of the silicon substrate 301 was maintained at 1150° C., $H_2$ (20 L/min), $NH_3$ (10 L/min), TMG (5 μmol/min), TMA (0.5 μmol/min), and silane ($SiH_4$) diluted with $H_2$ gas (0.01 μmol/min) were introduced to thereby grow an n-$Al_{0.15}Ga_{0.85}N$ layer vertically from the bottom surfaces of the trenches on the silicon substrate and laterally from the top surface of the posts and the sidewalls of the trenches in the silicon substrate. Lateral epitaxial growth was performed while the surfaces of upper portions of the posts primarily served as seeds, thereby filling the trenches formed in the substrate and thus establishing a flat top surface. Subsequently, $H_2$ (10 L/min), $NH_3$ (10 L/min), TMG (100 μmol/min), TMA (10 μmol/min), and silane ($SiH_4$) diluted with $H_2$ gas (0.2 μmol/min) were introduced to thereby grow the n-$Al_{0.15}Ga_{0.85}N$ layer to a thickness of 3 μm. Hereinafter, the trenched silicon substrate 301 and the n-$Al_{0.15}Ga_{0.85}N$ layer 302 are inclusively represented by a wafer 3000.

Figure 15:
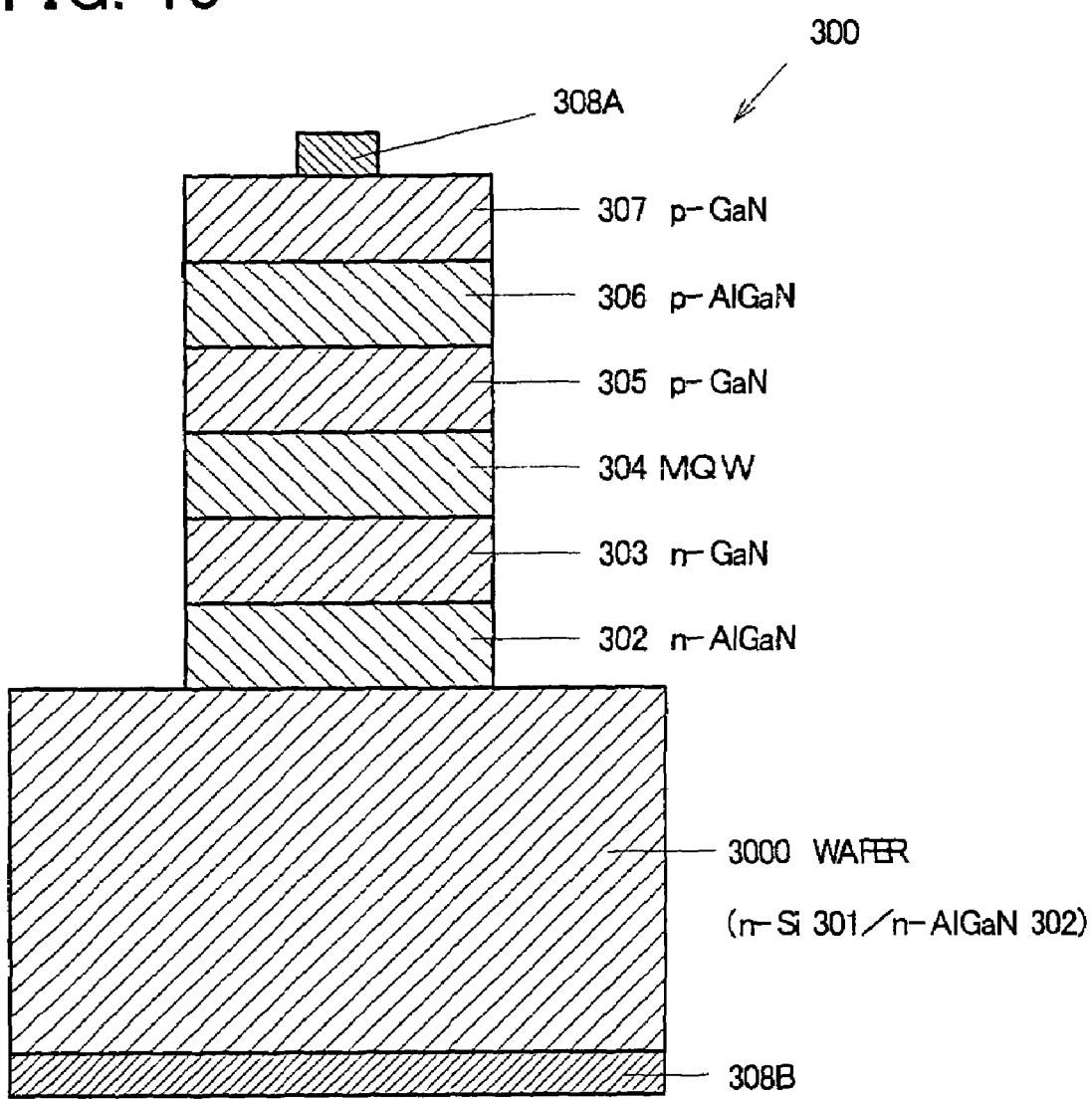
FIG. 15 is a sectional view showing a Group III nitride compound semiconductor light-emitting device according to a seventh embodiment of the present invention.

On the wafer 3000 (the trenched silicon substrate 301 and the n-$Al_{0.15}Ga_{0.85}N$ layer 302 formed on the substrate 301), an n-guide layer 303 of silicon (Si)-doped GaN, an MQW-structured light-emitting layer 304, a p-guide layer 305 of magnesium (Mg)-doped GaN, a p-clad layer 306 of magnesium (Mg)-doped $Al_{0.08}Ga_{0.92}N$, and a p-contact layer 307 of magnesium (Mg)-doped GaN were formed. Next, an electrode 308A of gold (Au) was formed on the p-contact layer 307, and an electrode 308B of aluminum (Al) was formed on the back side of the silicon substrate 301. The thus-formed laser diode (LD) 300 of FIG. 15 exhibited the significant improvement of device life and light-emitting efficiency.

Eighth Embodiment

Figure 16:
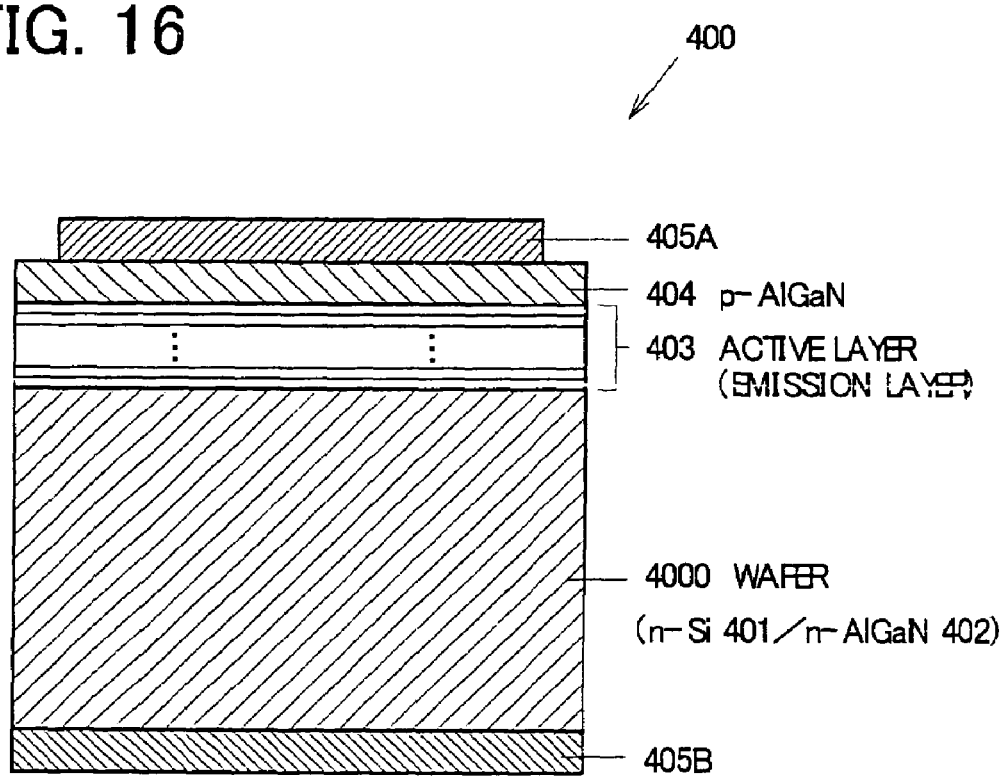
FIG. 16 is a sectional view showing a Group III nitride compound semiconductor light-emitting device according to an eighth embodiment of the present invention.

The present embodiment used a silicon (Si) substrate. As in the seventh embodiment which used a wafer comprising the trenched silicon substrate 301 and the n-$Al_{0.15}Ga_{0.85}N$ layer 302 formed thereon, the present embodiment used a wafer 4000 comprising a trenched silicon substrate 401 and an n-$Al_{0.15}Ga_{0.85}N$ layer 402 formed on the substrate 401. On the wafer 4000, a light-emitting layer 403 and a p-clad layer 404 of magnesium (Mg)-doped $Al_{0.15}Ga_{0.85}N$ were formed. Next, an electrode 405A of gold (Au) was formed on the p-clad layer 404, and an electrode 405B of aluminum (Al) was formed on the back side of the silicon substrate 401. The thus-formed light-emitting diode (LED) 400 of FIG. 16 exhibited the significant improvement of device life and light-emitting efficiency.

[Modification of Etching]

Figures 17A, 17B:
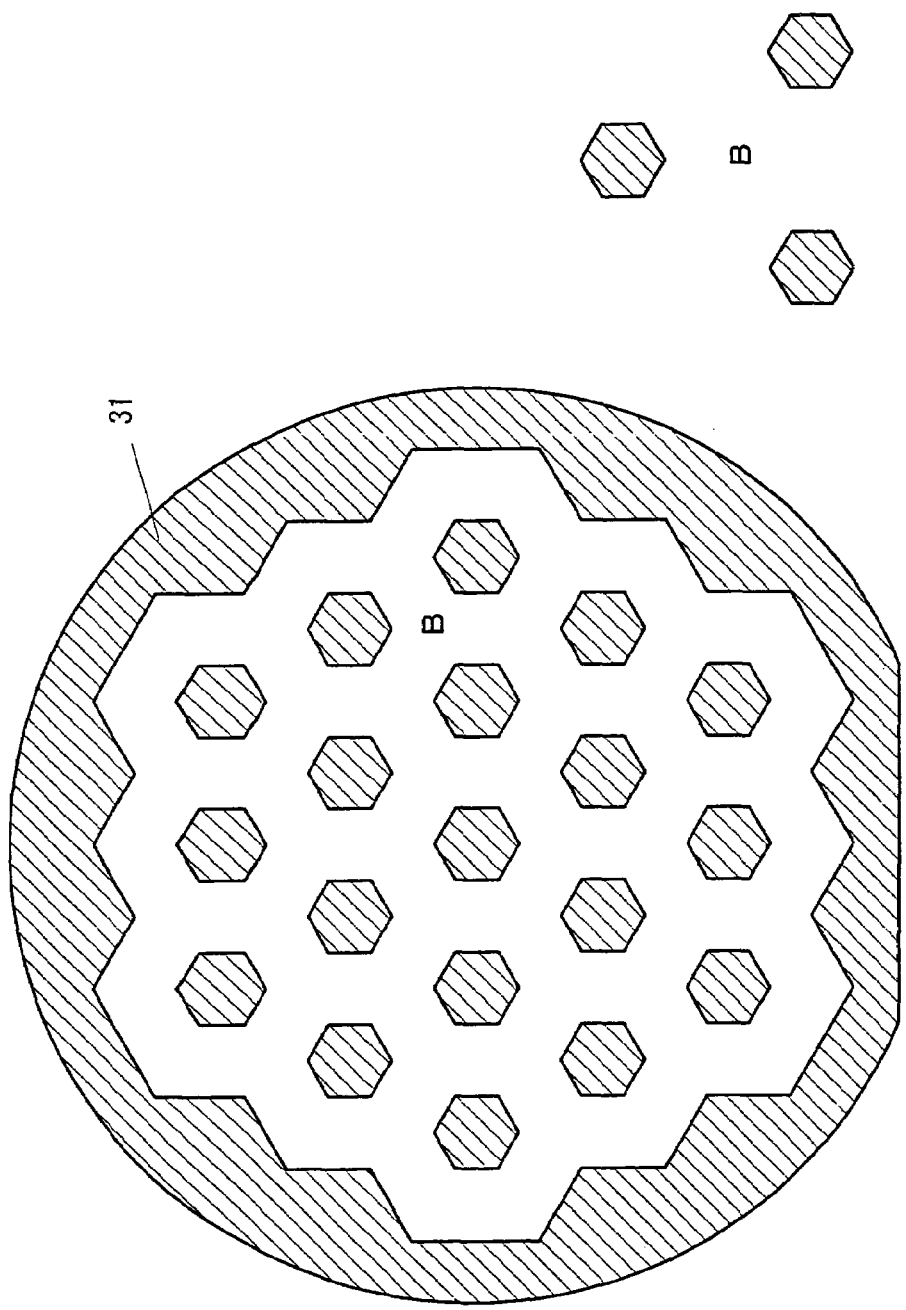
FIG. 17 is a schematic view showing another example of etching of a first Group III nitride compound semiconductor.
Figure 18:
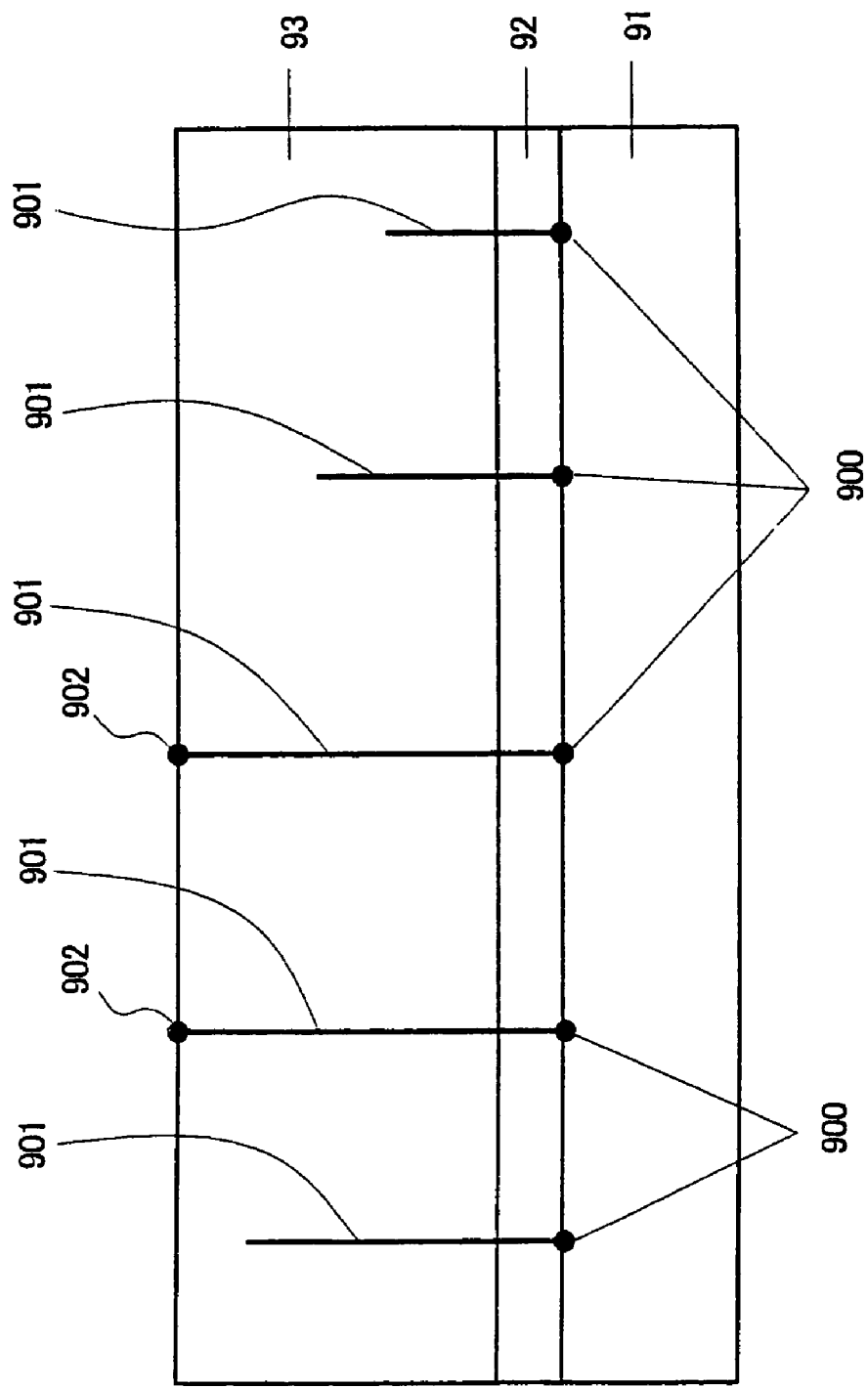
FIG. 18 is a sectional view showing threading dislocations propagating in a Group III nitride compound semiconductor.

The embodiment allow formation of island-like posts or formation of rugged portions B and smooth portions as shown in FIG. 17. To facilitate understanding, the schematic view of FIG. 17(a) includes a peripheral region. In actuality, tens of millions of island-like posts may be formed per wafer. In FIG. 17(a), the area of the bottoms of the trenches B is 3 times the area of the top surfaces of the island-like posts. In FIG. 17(b), the area of the bottoms of the trenches B is 8 times the area of the top surfaces of the island-like posts.

While the present invention has been described with reference to the above embodiments, the present invention is not limited thereto, but may be modified as appropriate without departing from the spirit of the invention.

The entire disclosures and contents of Japanese Patent Application No. 2000-71350, from which the present invention claims convention priority, are incorporated herein by reference.

The invention claimed is:

1. A Group III nitride compound semiconductor device, comprising:
    a substrate consisting of a single layer, including a post and a trench, which includes at least one structure of a dot-like structure, a stripe-shaped structure, and a grid-like structure formed at an upper portion thereof and made of itself, said post and trench having a side wall perpendicular to a surface of said substrate;
    a buffer layer of a Group III nitride compound semiconductor uniformly formed on said post and on said trench of said substrate along a surface of said substrate, said buffer layer comprising a portion formed on said post and a portion formed in said trench and being a layer for growing a single crystal of Group III nitride compound semiconductor from said buffer layer;
    a first Group III nitride compound semiconductor layer having a uniform thickness and formed on said buffer layer along said post and said trench of said substrate, and comprising a single crystal portion formed on said post and a single crystal portion formed in said trench; and
    a second Group III nitride compound semiconductor layer formed on said first Group III nitride compound semiconductor layer, said second Group III nitride compound semiconductor layer being buried in said trench of said substrate and formed on said first Group III nitride compound semiconductor layer and having an upper surface which is uniformly flat,
    wherein said portion of said buffer layer which is formed on said post of said substrate, and said portion of said buffer layer which is formed in said trench of said substrate are separate.

2. A Group III nitride compound semiconductor device according to claim 1, wherein a thickness of said buffer layer has a range from 100 Å to 500 Å.

3. A Group III nitride compound semiconductor device according to claim 1, wherein said second Group III nitride compound semiconductor layer includes a cavity about said trench.

4. A Group III nitride compound semiconductor device according to claim 1, wherein said upper surface of said second Group III nitride compound semiconductor layer comprises a smooth surface.

5. A Group III nitride compound semiconductor device according to claim 1, wherein said second Group III nitride compound semiconductor layer is formed on said post and trench of said substrate and on an upper surface of said first Group III nitride compound semiconductor layer.

6. A Group III nitride compound semiconductor device according to claim 5, wherein said second Group III nitride compound semiconductor layer is formed directly on said post and trench of said substrate and on an upper surface of said first Group III nitride compound semiconductor layer.

7. A Group III nitride compound semiconductor device according to claim 1, wherein said first Group III nitride compound semiconductor layer comprises a seed layer for growth of said second Group III nitride compound semiconductor layer.

8. A Group III nitride compound semiconductor device according to claim 1, wherein said second Group III nitride compound semiconductor layer includes a cavity formed beneath said upper surface of said second Group III nitride compound semiconductor layer.

9. A Group III nitride compound semiconductor device according to claim 8, wherein a wall of said cavity is formed from a coalesced growth front of said second Group III nitride compound semiconductor layer.

10. A Group III nitride compound semiconductor device according to claim 1, wherein said buffer layer comprises a multi-component layer comprising layers having different compositions.

11. A Group III nitride compound semiconductor device according to claim 1, wherein said portion of said first Group III nitride compound semiconductor layer which is formed on said post of said substrate, and said portion of said first Group III nitride compound semiconductor layer which is formed in said trench of said substrate are separate.

12. A Group III nitride compound semiconductor device according to claim 1, wherein said side wall of said post and trench of said substrate is perpendicular to a bottom surface of said trench of said substrate.

13. A Group III nitride compound semiconductor device according to claim 1, wherein said second Group III nitride compound semiconductor layer is formed on a sidewall of said portion of said buffer layer which is formed on said post of said substrate.

14. A Group III nitride compound semiconductor device according to claim 1, wherein said second Group III nitride compound semiconductor layer is formed on a sidewall of said portion of said first Group III nitride compound semiconductor layer which is formed on said post of said substrate.

15. A Group III nitride compound semiconductor device, comprising:
    a substrate consisting of a single layer, including a post and a trench, which includes at least one structure of a dot-like structure, a stripe-shaped structure, and a grid-like structure formed at an upper portion thereof and made of itself, said post and trench having a side wall perpendicular to a surface of said substrate;
    a buffer layer of a Group III nitride compound semiconductor uniformly formed on said post and on said trench of said substrate along a surface of said substrate, said buffer layer comprising a portion formed on said post and a portion formed in said trench and being a layer for growing a single crystal of Group III nitride compound semiconductor from said buffer layer;
    a first Group III nitride compound semiconductor layer having a uniform thickness and formed on said buffer layer along said post and said trench of said substrate, and comprising a single crystal portion formed on said post and a single crystal portion formed in said trench; and
    a second Group III nitride compound semiconductor layer formed on said first Group III nitride compound semiconductor layer, said second Group III nitride compound semiconductor layer being buried in said trench of said substrate and formed on said first Group III nitride compound semiconductor layer and having an upper surface which is uniformly flat, wherein said portion of said buffer layer which is formed on said post of said substrate, and said portion of said buffer layer which is farmed in said trench of said substrate are separate, wherein said Group III nitride compound semiconductor device comprises a light-emitting device.

16. A Group III nitride compound semiconductor light-emitting device according to claim 15, wherein a thickness of said buffer layer has a range from 100 Å to 500 Å.

17. A Group III nitride compound semiconductor light-emitting device according to claim 15, wherein said second Group III nitride compound semiconductor layer includes a cavity about said trench.

* * * * *